(12) United States Patent
Yamawaki

(10) Patent No.: US 6,268,559 B1
(45) Date of Patent: Jul. 31, 2001

(54) PHOTOVOLTAIC GENERATION SYSTEM, WIRING APPARATUS FOR PHOTOVOLTAIC GENERATION SYSTEM, AND WIRING STRUCTURE THEREFOR

(75) Inventor: Takeharu Yamawaki, Moriyama (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/413,010

(22) Filed: Oct. 6, 1999

(30) Foreign Application Priority Data

Mar. 24, 1999 (JP) ................................................ 11-080283

(51) Int. Cl.[7] ............................ H01L 31/042; H02J 1/00
(52) U.S. Cl. ...................... 136/244; 136/243; 136/293; 307/11; 307/12; 307/43; 307/71; 307/77; 307/78
(58) Field of Search ...................................... 136/244, 243, 136/293; 307/12, 11, 43, 71, 77, 78

(56) References Cited

U.S. PATENT DOCUMENTS 4,321,416   3/1982   Tennant ................................ 136/244

FOREIGN PATENT DOCUMENTS

| 19502949 A1 | * | 8/1995 | (DE) . |
|---|---|---|---|
| 2265264 | | 9/1993 | (GB) . |
| 52-135081 | | 11/1977 | (JP) . |
| 6-84410 | * | 3/1994 | (JP) . |
| 6-084410 | | 3/1994 | (JP) . |
| 7-131045 | | 5/1995 | (JP) . |
| 10-135499 | * | 5/1998 | (JP) . |

OTHER PUBLICATIONS

Sotolongo, 15th IEEE Photovoltaic Specialists Conference, Kissimmee, FL, pp. 1382–1385, May 12–15, 1981, published Aug. 1981.*
Derwent abstract, Acc. No. 1999–168598, Feb. 1999.*
Patent abstracts of Japan vol. 1998, No. 10, Aug. 31, 1998, abstract for JP 10–135499.
European Search Report EP 99 11 9177, Jun. 26, 2000.

* cited by examiner

Primary Examiner—Alan Diamond
(74) Attorney, Agent, or Firm—Hogan & Hartson L.L.P.

(57) ABSTRACT

A wiring apparatus comprises a trunk cable, branch junctions, and branch cables diverging individually from the branch junctions. A plurality of photovoltaic modules, which are arranged side by side on a roof of a building or the like, or module units, composed of the modules, serve as generating sections. The respective outputs of the generating sections are lead into the building by means of a trunk conductor of the trunk cable. Each branch cable includes a branch conductor that is connected to the trunk conductor of the trunk cable. Each branch cable of the wiring apparatus is connected to a connector for use as an output terminal of the module units by means of a connector attached to the distal end portion thereof. The module units are connected in parallel with one another by means of the wiring apparatuses, and their respective outputs are supplied to loads in the building by means of a pair of lead-in wires.

14 Claims, 18 Drawing Sheets

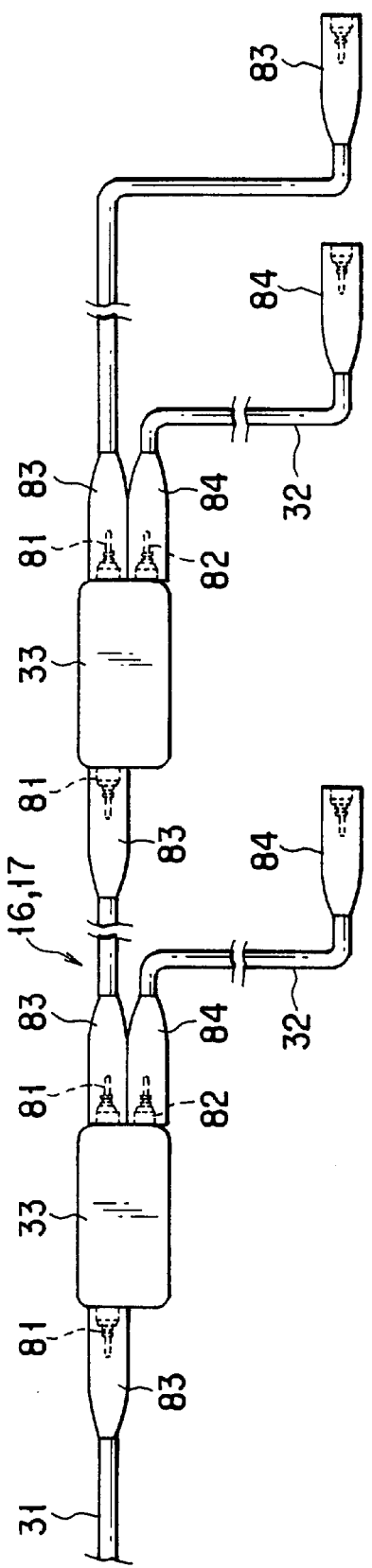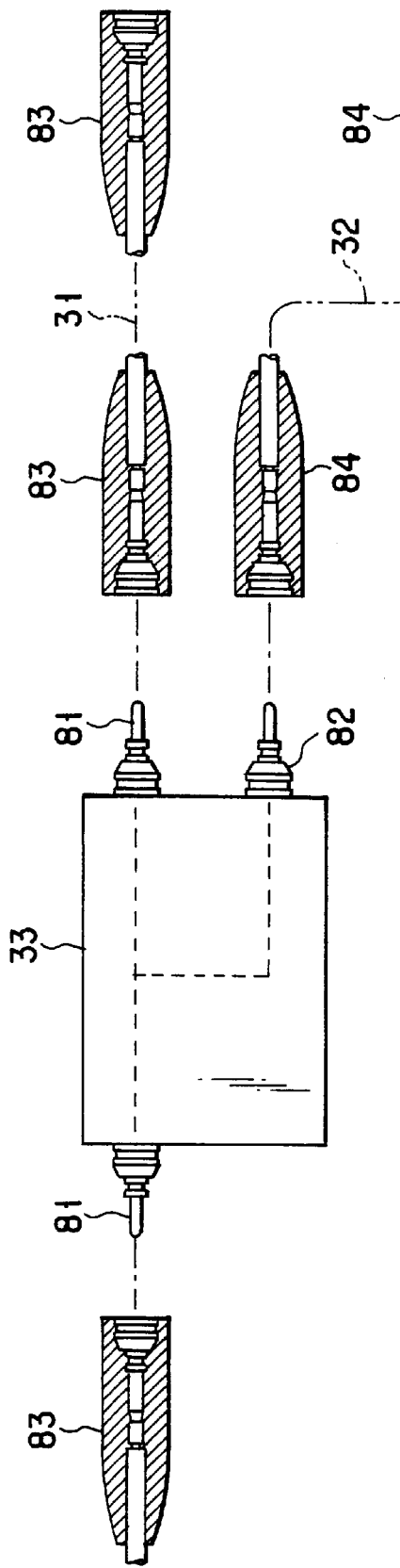
FIG. 18A
FIG. 18B

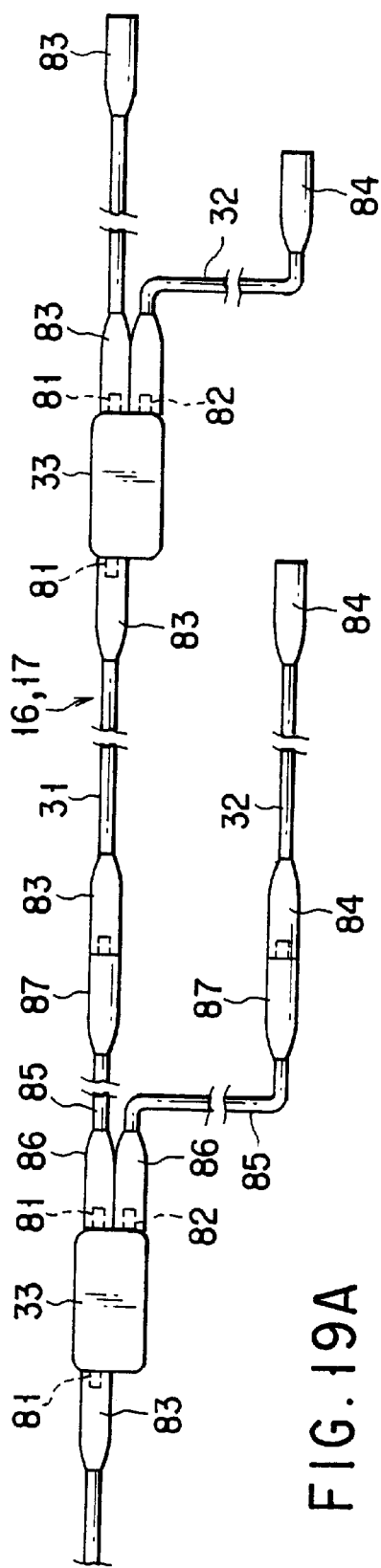
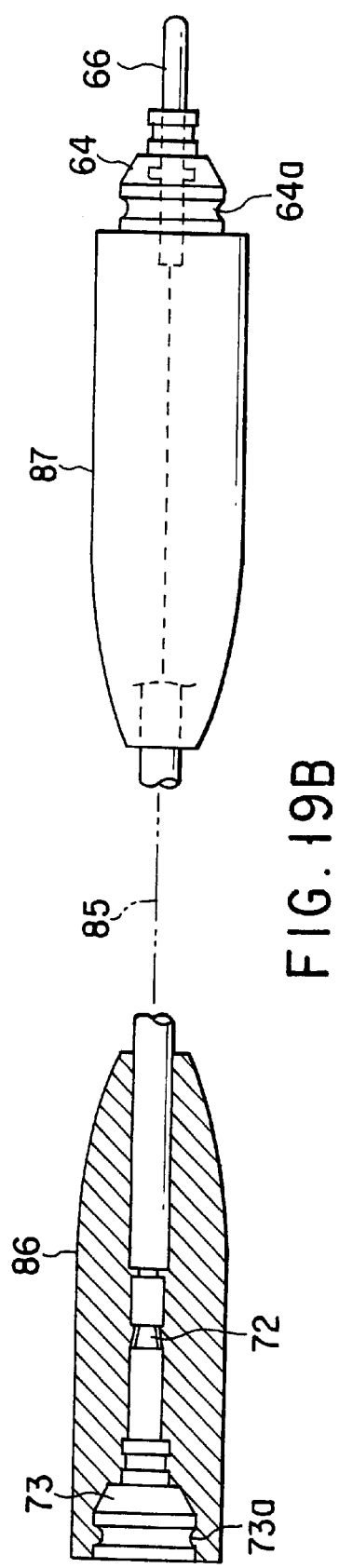
FIG. 19A
FIG. 19B

PHOTOVOLTAIC GENERATION SYSTEM, WIRING APPARATUS FOR PHOTOVOLTAIC GENERATION SYSTEM, AND WIRING STRUCTURE THEREFOR

BACKGROUND OF THE INVENTION

The present invention relates to a photovoltaic generation system capable of obtaining electric power by means of photovoltaic cells arranged on, for example, a roof of a building, and a wiring apparatus and a wiring structure for conducting electric power produced by the generation system into the building such as a house.

A photovoltaic generation system comprises generating sections each including a plurality of photovoltaic modules, which can generate outputs corresponding to a desired power generation, and wiring apparatuses for conducting the outputs of the generating sections to an inverter unit and the like in a building or house. The generating sections include photovoltaic modules, each formed of a plurality of photovoltaic cells connected in series or parallel with one another, or photovoltaic module units, each formed of a plurality of photovoltaic modules combined together. Normally, one photovoltaic module has one terminal box. The terminal box has two output terminals for positive and negative electrodes. Electric power generated by the photovoltaic module is outputted via the terminal box.

In this power generation system, the module units that are arranged side by side are connected in series and/or parallel with one another. Described in Jpn. Pat. Appln. KOKAI Publication No. 7-131045 is a wiring apparatus that can be suitably used to connect a plurality of photovoltaic modules in series with one another. This prior art, as shown in FIG. 24, wiring apparatus comprises a trunk 1, which includes a pair of electric wires 2 and 3, and branch lines 4 connected in series with one of the wires 2 and 3 of the trunk 1. These branch lines 4 are connected at given spaces in the longitudinal direction of the one wire 2. Connecting portions 5 that are connected to the respective output terminals 6 of the module units 7 are provided on the respective distal end portions of the branch lines 4, individually. This prior art wiring apparatus has a two-core, series-connected structure.

Other conventional wiring apparatuses than the prior art example described above comprise electric wires that are connected individually to the respective output terminals of a plurality of photovoltaic modules or the respective positive and negative output terminals of a plurality of photovoltaic module units. These electric wires are led into a building.

According to the above-described structure in which a large number of wiring apparatuses are connected for each output terminal of each photovoltaic module or module unit and are all led into the building, the wire length of each wiring apparatus that extends from each output terminal of each module or module unit to the interior of the building is substantial. Accordingly, the entire photovoltaic generation system requires use of a lot of electric wires. Besides, a lot of wiring apparatuses are needed. In the case of a photovoltaic generation system that uses 120 photovoltaic modules, for example, the photovoltaic module units are 20 in all if each module unit is formed by connecting six photovoltaic modules in series with one another. In this case, therefore, the wiring structure of the prior art example in which all the electric wires connected individually to the photovoltaic module units are led into the building requires use of 40 single-core wiring apparatuses or 20 two-core wiring apparatuses. The use of the two-core, series-connected wiring apparatuses only ensures the formation of photovoltaic module units that each include a plurality of photovoltaic modules connected in series with one another. The two-core wiring apparatuses can not connect photovoltaic modules in parallel.

Thus, fetching outputs conventionally requires use of many wiring apparatuses, so that the installation of the photovoltaic generation system on a roof or the like costs much labor. Accordingly, there is a high possibility of misconnection. Since a large hole for a lot of wiring apparatuses must be bored through a wall of the building, so that sealing the building against rainwater and the like entails labor.

The conventional wiring apparatuses extend long from the respective output terminals of the photovoltaic modules or module units into the building. Therefore, the wiring apparatuses that are connected to the photovoltaic module units and the like are liable to hinder maintenance operation for the modules and other elements. Since the existing wiring apparatuses cannot be made longer, moreover, they cannot cope with extension of the photovoltaic modules.

In the case where a plurality of photovoltaic modules or module units are connected in series with one another, connection is made by using dedicated wiring apparatuses for series connection, such as the one described in the aforesaid publication. In the case where a plurality of photovoltaic modules or module units are connected in parallel with one another, connection is made by using dedicated wiring apparatuses for parallel connection. Thus, the wiring apparatuses used are varied in type, and their productivity is poor. Besides, prearrangement for laying operation, as well as the laying operation itself, is complicated. If the connection of the wiring apparatuses requires change to cope with the extension of the photovoltaic modules or maintenance operation, it cannot be achieved with ease.

In wiring apparatuses represented by the aforesaid two-core wiring apparatuses that comprises a trunk and branch lines, branch junctions of the branch lines are expected to be molded from synthetic resin. Possibly, however, outdoor portions of the wiring apparatuses may be exposed to rainwater, so that the branch junctions require high reliability to resist penetration of water.

BRIEF SUMMARY OF THE INVENTION

Accordingly, a first object of the present invention is to provide a wiring apparatus for a photovoltaic generation system, whereby the necessary number of electric wires for fetching outputs from generating sections, including a plurality of photovoltaic modules or module units, can be reduced, and which can be easily laid with a lower possibility of wrong wiring.

A second object of the invention is to provide a wiring apparatus, in which auxiliary cables are used to improve the laying efficiency for wiring operation and the maintainability of photovoltaic modules and to cope with extension or modification of the photovoltaic modules.

A third object of the invention is to provide a wiring apparatus, in which junction cables can be connected to branch junctions to improve the maintainability of photovoltaic modules and cope with extension or modification of the photovoltaic modules.

A fourth object of the invention is to provide a wiring apparatus for a photovoltaic generation system, capable of being improved in reliability of water proofing of branch junctions.

A fifth object of the invention is to provide a wiring apparatus, whereby prearrangement for the installation and laying efficiency of a photovoltaic generation system and the productivity thereof can be improved.

A sixth object of the invention is to provide a wiring apparatus capable of conducing to the improvement of the output of a photovoltaic generation system.

A seventh object of the invention is to provide a wiring apparatus capable of being easily connected to the output terminal of a photovoltaic module or module unit.

An eighth object of the invention is to provide a photovoltaic generation system capable of achieving at least the first one of the objects described above.

A ninth object of the invention is to provide a wiring structure for a photovoltaic generation system, capable of achieving at least the first one of the objects described above.

In order to achieve the first object, according to the present invention, there is provided a wiring apparatus, whereby the respective output terminals of a plurality of generating sections, each including photovoltaic modules, are connected to one another. The apparatus comprises a trunk cable including a trunk conductor for conducting the respective outputs of the generating sections, a plurality of branch cables diverging individually from a plurality of longitudinally intermediate portions of the trunk cable, each of the branch cables including a branch conductor having one end connected electrically to a longitudinally intermediate portion of the trunk conductor and the other end connected electrically to the output terminal of each corresponding generating section, and branch junctions formed between the trunk cable and the branch cables.

With use of this wiring apparatus of the invention, the photovoltaic modules or module units are connected in parallel with one another by means of the common trunk cable. Accordingly, the number of wiring apparatuses that extend from the terminals of the photovoltaic modules or module units into a building can be reduced. Besides, the common trunk cable is used for the parallel-connected modules or module units. Therefore, each branch cable is expected to have only a short length ranging from the trunk cable to the output terminal of each photovoltaic module or module unit. Thus, necessary wiring apparatuses for the entire photovoltaic generation system and electric wires attached thereto can be reduced in number. Since the number of electric wires that extend from the respective output terminals of the photovoltaic modules or module units into the building is reduced, moreover, laying can be carried out with ease, and the possibility of wrong wiring can be lowered.

In order to achieve the second object, a wiring apparatus according to the invention further comprises connectors for connecting auxiliary cables, the connectors being attached individually to the respective ends of the trunk cable and the branch cables. According to the invention, the respective ends of the trunk and branch cables are connected to the output terminals of the photovoltaic modules or module units by means of the connectors thereon. Accordingly, the wiring apparatus can be easily connected to each output terminal. Since the connectors can be disengaged from the output terminals, the photovoltaic modules and the wiring apparatus can be separated from one another as maintenance operation for the modules is carried out. If necessary, moreover, the connectors may be connected individually with connectors on auxiliary trunk or branch cables. Depending on the use of the auxiliary cables or the number of auxiliary cables used, therefore, the respective lengths of the trunk and branch cables can be changed. Thus, the lengths of the trunk and branch cables can be adjusted according to the layout or configuration of the photovoltaic modules or module units, and the photovoltaic modules can be increased for extension or rearranged with ease. According to the invention, moreover, wiring operation for the photovoltaic generation system is easy. Since the photovoltaic modules and the wiring apparatus can be separated from one another during the maintenance of the modules, furthermore, the maintainability of the modules is improved.

In order to achieve the third object, a wiring apparatus according to the invention comprises cable connecting portions at each branch junction. The trunk cable and the branch cables are removably connected to the cable connecting portions by means of connectors. A junction cable having first and second connectors may be provided between each cable connecting portion and the trunk or branch cable to be connected thereto. In the maintenance of the photovoltaic modules, the modules and wiring apparatus can be separated from one another by disengaging the trunk and branch cables from the cable connecting portion. Thus, the maintainability of the photovoltaic modules and the like can be improved. If necessary, moreover, the junction cable can be connected between each cable connecting portion and the cable separated therefrom. Depending on the use of the junction cable, therefore, the respective lengths of the trunk and branch cables can be changed. Thus, the lengths of the trunk and branch cables can be adjusted according to the layout or configuration of the photovoltaic modules or module units, and the photovoltaic modules can be increased for extension or rearranged with ease.

In order to achieve the fourth object, a wiring apparatus according to the invention is designed so that a cover member on each branch junction is thermowelded to protective sheath on the trunk or branch cable. The cover member and the protective sheath are formed of the same synthetic resin material. According to the invention, the fusibility of the cable connecting portion of the branch junction having the cover member and the protective sheath on the cables is improved. According to the invention, moreover, the cable connecting portions and the protective sheaths are firmly integrally formed with one another, whereby the reliability of water proofing is improved.

In order to achieve the fifth object, a wiring apparatus according to the invention comprises switches at the branch junctions for use as circuit changing means for switching the connection between the photovoltaic modules or module units to a series- or parallel-connection mode. In connecting the photovoltaic modules or module units in series with one another, the switches are shifted to the series-connection mode so that the trunk and branch cables are fit for series connection. In connecting the photovoltaic modules or module units in parallel with one another, the switches are shifted to the parallel-connection mode so that the trunk and branch cables are fit for parallel connection. Thus, the wiring apparatus can connect the photovoltaic modules or module units as required in series or parallel with one another. According to the invention, wiring apparatuses need not be produced separately for series and parallel connections, so that the productivity of the wiring apparatuses can be improved. Besides, a desired circuit can be formed quickly by shifting the switches to the series- or parallel-connection mode at the scene of installation of the photovoltaic generation system.

In order to achieve the sixth object, each branch junction of the wiring apparatus according to the invention includes an electric circuit for connecting the photovoltaic modules or module units with one another, the electric circuit having a check diode for preventing current from flowing from higher-output generating sections, out of the parallel-connected generating sections, to lower-output generating sections. In the photovoltaic generation system, the respective outputs of some photovoltaic modules or module units sometimes may become lower than those of others or be reduced to zero. If the modules or module units are connected in parallel with one another in this case, the output currents of high-output photovoltaic modules or module units sometimes may flow back into low-output (or zero-output) photovoltaic modules or module units through the wiring apparatus. Since each branch junction is provided with the check diode, according to the invention, the output currents of the other modules or module units are prevented from flowing back into some reduced-output modules or module units, so that the general output of the photovoltaic generation system is improved.

In order to achieve the seventh object, a wiring apparatus according to the invention is designed so that the trunk cable and the branch cables are provided individually with connectors that are removably connected to the respective output terminals of the photovoltaic modules or module units. Since the trunk cable or branch cables are connected to the output terminals of the modules or module units by means of the connectors, according to the invention, laborious connecting operation such as soldering need not be carried out at the scene of installation of the photovoltaic generation system.

In order to achieve the eighth object, a photovoltaic generation system according to the invention comprises a plurality of generating sections, each including photovoltaic modules located outside a building or module units formed by combining the modules each, and aforesaid wiring apparatuses connected individually to the respective output ends of the generating sections.

In order to achieve the ninth object, a wiring structure for a photovoltaic generation system according to the invention is designed so that the respective output terminals of a plurality of generating sections, each including photovoltaic modules located outside the building, are connected individually by means of the wiring apparatuses, and the trunk cable or lead-in wires connected thereto are led into the building, in order to conduct the respective outputs of the generating sections to loads in the building by means of wiring apparatuses. According to the invention, wiring operation for the photovoltaic generation system is easy, and the photovoltaic modules, etc. can be easily laid on a roof or the like. Further, the possibility of misconnection is lowered, and only a small hole for the wiring apparatuses is expected to be bored through a wall of the building.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 18A is a partial side view of a wiring apparatus used in a photovoltaic generation system according to a fifth embodiment of the invention;

FIG. 18B is a side view, partially in section, showing the wiring apparatus of FIG. 18A;

FIG. 19A is a side view showing the wiring apparatus and junction cables used in the system according to the fifth embodiment;

FIG. 19B is a side view, partially in section, showing one of the junction cables of FIG. 19A;

DETAILED DESCRIPTION OF THE INVENTION

Several embodiments of the present invention will now be described with reference to the accompanying drawings.

Figure 1:
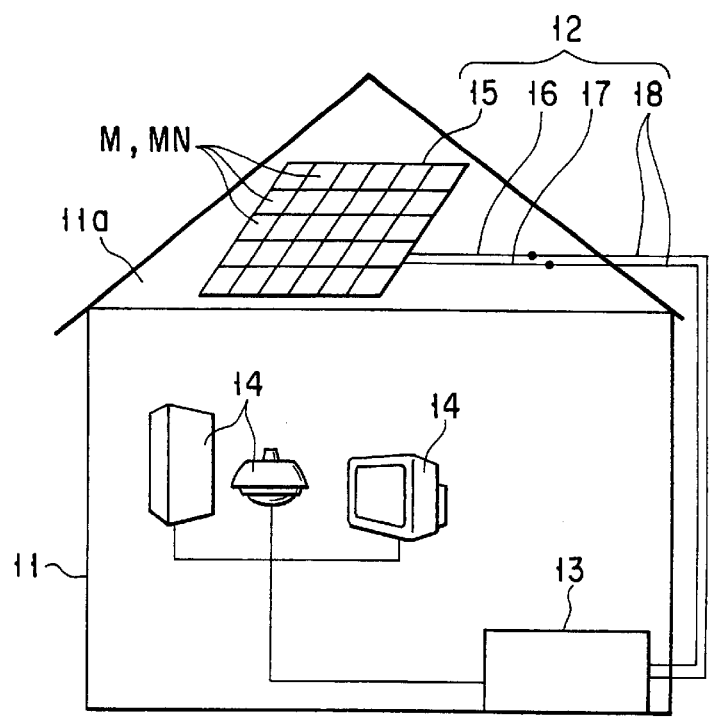
FIG. 1 is a conceptual diagram showing the relations between a photovoltaic generation system according to a first embodiment of the present invention and its loads.

FIGS. 1 to 9B show a first embodiment of the invention. FIG. 1 is a conceptual diagram showing the relations between a photovoltaic generation system 12 attached to a building (e.g., house 11) and its loads 14. The generation system 12 is installed outside the house 11. An inverter unit 13 and the loads 14, including electric appliances, etc., are arranged in the house 11. These loads 14 are supplied with electric power from the system 12 via the inverter unit 13.

The photovoltaic generation system 12 comprises a photovoltaic panel (so-called solar-cell panel) 15 on a roof 11a, wiring apparatuses 16 and 17 for fetching the output of the panel 15, and a pair of lead-in wires 18 for conducting electric power fetched by means of the apparatuses 16 and 17 into the house. The photovoltaic panel 15 may be a roofing material that constitutes part of the roof 11a. Alternatively, the panel 15 may be formed independently of the roof 11a and put on it. The photovoltaic panel 15 is composed of a plurality of photovoltaic modules M or photovoltaic module units MN. Each module M includes a plurality of photovoltaic cells (so-called solar cells) that are arranged in a matrix. Each module unit MN includes a plurality of modules M that are arranged in a matrix. The photovoltaic modules M and the module units MN function as generating sections. The cells that form each module M may be arranged in any number or mode or of any type (crystalline or amorphous). Amorphous cells are used in the first embodiment. One end of each of the single-core wiring apparatuses 16 and 17 (which will be described in detail later) is connected to the output terminals of the modules M or module units MN. The other end of each wiring apparatus is connected to one end of its corresponding lead-in wire 18. The other end of each lead-in wire 18 is connected to the inverter unit 13 in the house.

Figure 2:
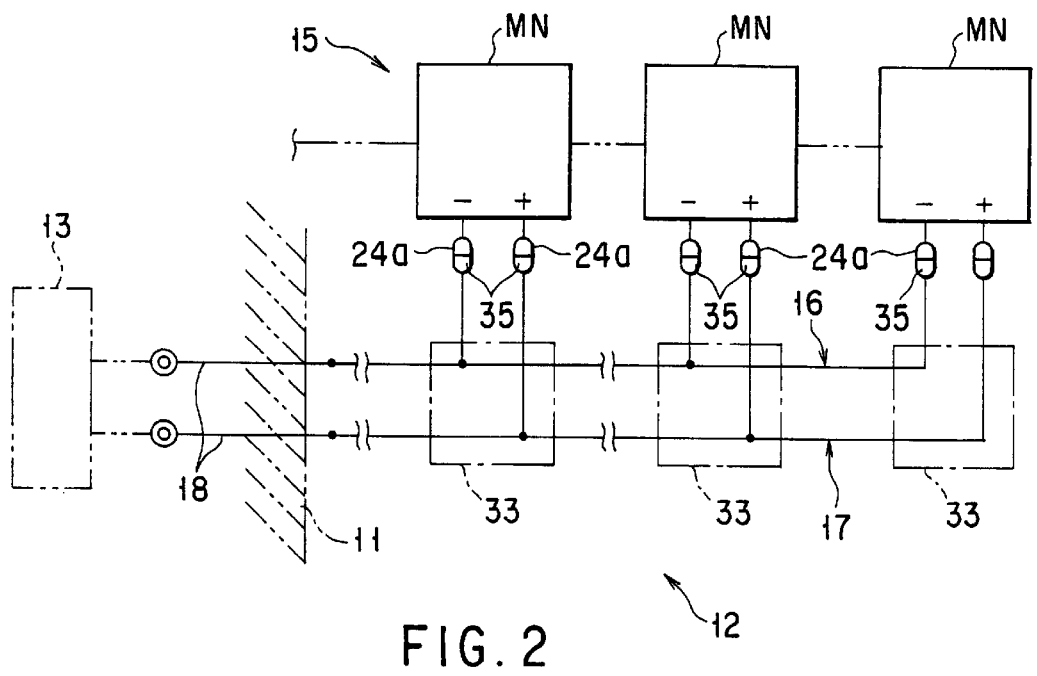
FIG. 2 is a circuit diagram showing a case where module units of the system according to the first embodiment of the invention are connected in parallel with one another.
Figure 3:
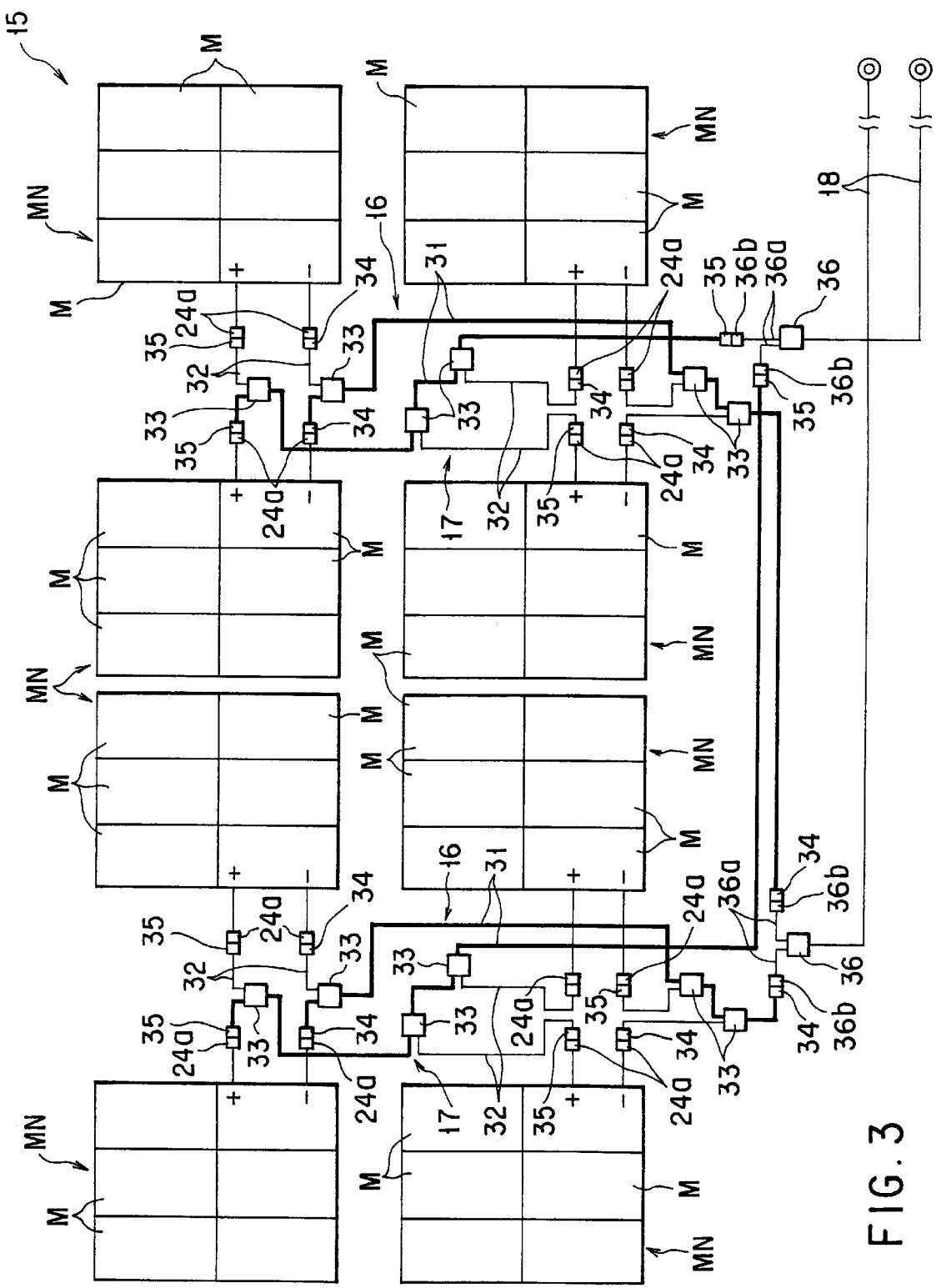
FIG. 3 is a circuit diagram showing connections between wiring apparatuses of the system according to the first embodiment and lead-in wires.
Figure 4:
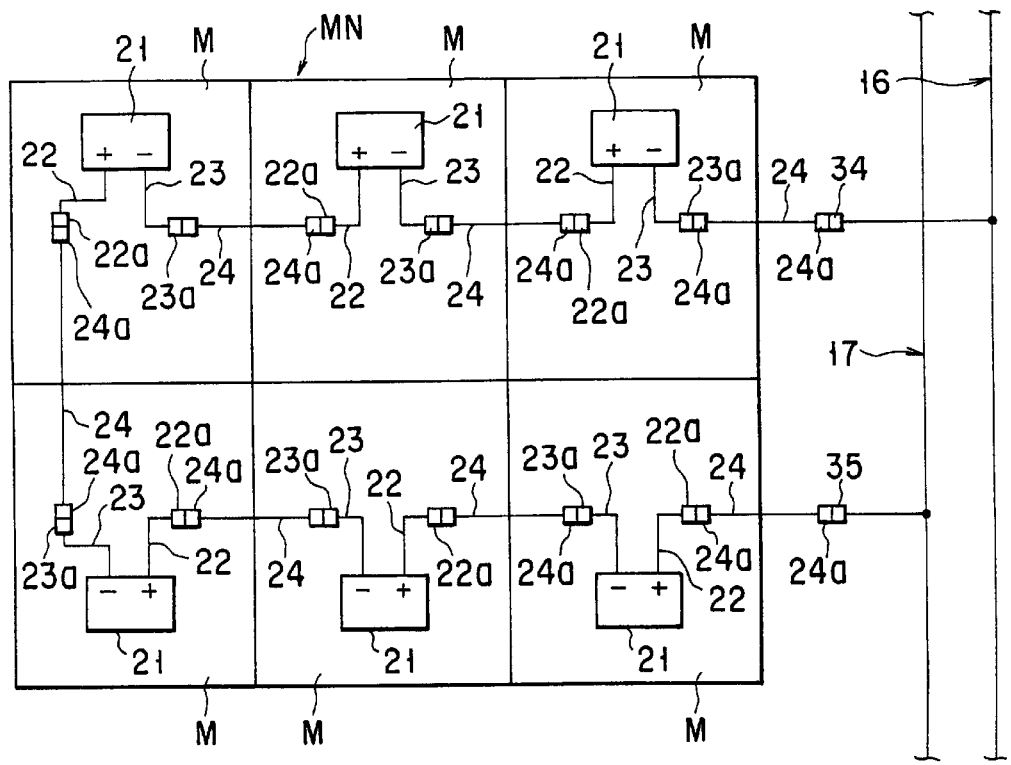
FIG. 4 is a circuit diagram showing a wiring structure in the system according to the first embodiment, having photovoltaic modules connected in series with one another.
Figure 5:
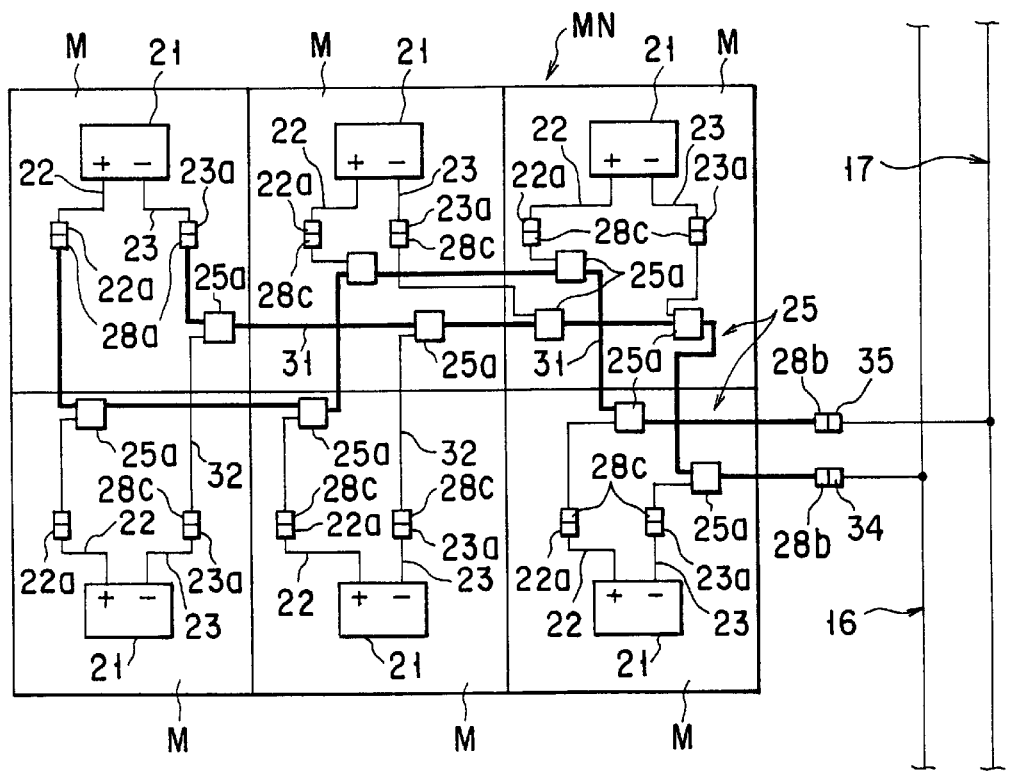
FIG. 5 is a circuit diagram showing a wiring structure in the system according to the first embodiment, having the photovoltaic modules connected in parallel with one another.
Figure 6:
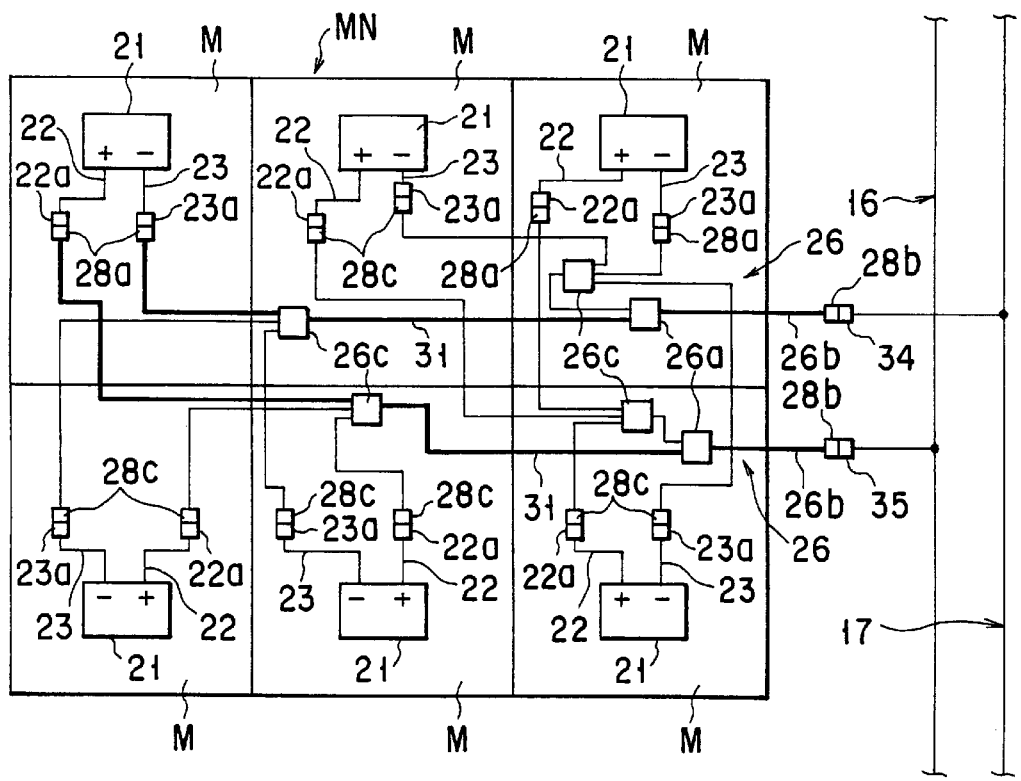
FIG. 6 is a circuit diagram showing a wiring structure in the system according to the first embodiment, having the photovoltaic modules connected by means of alternative wiring apparatuses.
Figure 7:
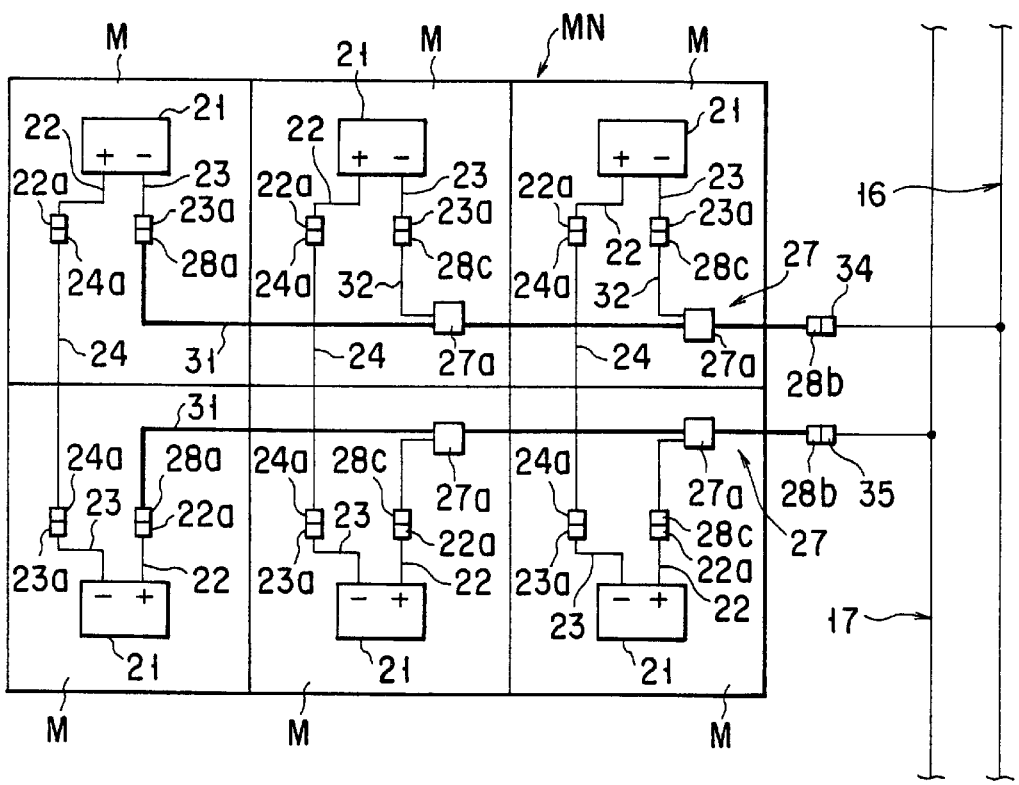
FIG. 7 is a circuit diagram showing a wiring structure in the system according to the first embodiment, having the photovoltaic modules connected in series and parallel with one another.

As shown in FIG. 2, the module units MN that constitute the photovoltaic panel 15 are connected electrically in parallel with one another by means of the two wiring apparatuses 16 and 17. As shown in FIG. 3, the panel 15 is composed of, for example, eight module units MN. Each module unit MN includes six modules M. The six modules M that constitute each module unit MN are connected in series and/or parallel with one another, depending on the required output. Six modules M shown in FIG. 4 are connected in series with one another by means of connecting wires 24. Six modules M shown in FIG. 5 or 6 are connected in parallel with one another by means of wiring apparatuses 25 or 26. Six modules M shown in FIG. 7 are connected in series and parallel with one another by means of wiring apparatuses 27.

Each of the module units MN shown in FIGS. 4 to 7 has terminal boxes 21 that are mounted individually on the respective back surfaces of the modules M. Each terminal box 21 is provided with two output terminals 22 and 23. The one output terminal 22 is composed of a single-core lead wire led out of the terminal box 21 and a connector 22a connected to the lead wire. Likewise, the other output terminal 23 is composed of a single-core lead wire led out of the terminal box 21 and a connector 23a connected to the lead wire. The output terminals 22 and 23 serve for positive and negative electrodes, respectively. A connector 24a is provided on each end of each of the single-core connecting lines 24 shown in FIGS. 4 and 7. The first, second, and third single-core wiring apparatuses 25, 26 and 27 shown in FIGS. 5, 6 and 7, respectively, function as output fetching lines for parallel connection.

Any of the wiring apparatuses 25, 26 and 27 are constructed in the same manner as the wiring apparatuses 16 and 17 that are connected individually to the lead-in wires 18. Each first wiring apparatus 25 includes a trunk cable 31 (indicated by a thick line in FIG. 5) and branch junctions 25a, e.g., five in number, which are attached individually to longitudinally intermediate portions of the cable 31. As shown in FIG. 7, each third wiring apparatus 27 includes a trunk cable 31 (indicated by a thick line in FIG. 7) and two branch junctions 27a attached individually to longitudinally intermediate portions of the cable 31. One branch cable 32 (indicated by a fine line in FIGS. 5 and 7) diverges from each of the branch junctions 25a and 27a. Connectors 28a and 28b are connected individually to the opposite ends of each trunk cable 31. A connector 28c is connected to the distal end of each branch cable 32. As shown in FIG. 6, two trunk cables 31 (indicated by thick lines in FIG. 6) are used in this generation system. One end of each trunk cable 31 is connected to one trunk output line 26b by means of a branch junction 26a. Each output line 26b is a part of the corresponding trunk cable 31. A plurality of branch cables (e.g., two in number, indicated by fine lines in FIG. 6) diverge from the junction 26c. A connector 28b is attached to the distal end of each trunk output line 26b. A connector 28a is attached to the distal end of each trunk cable 31. A connector 28c is connected to the distal end of each branch cable that diverges from the junction 26c.

In the case of the module unit MN shown in FIG. 4, the output terminals 22 and 23 of each of the six modules M are connected by means of the connecting wire 24. The respective output terminals 22 and 23 of the two modules M that are situated on the opposite ends of the electric circuit are connected to the wiring apparatuses 16 and 17, respectively, by means of connecting wires 24 and connectors 24a that are different in polarity. The connectors 24a, which project outward from the module unit MN, are used as output ends of the module unit MN. In this series connection (FIG. 4), the connectors 22a and 23a of each module M and the connectors 24a on the connecting wires 24 are removably connected to one another by mating.

In the module unit MN shown in FIG. 5, the six modules M are connected in parallel with one another by means of a pair of first wiring apparatuses 25 for positive and negative electrodes. A connector 28b is attached to one end of each wiring apparatus 25 that protrudes from the module unit MN. The connector 28b functions as an output terminal of the module unit MN. In this parallel connection, the connectors 22a and 23a of each module M and the connectors 28a and 28c of the wiring apparatuses 25 are removably connected to one another by mating.

In the module unit MN shown in FIG. 6, the six modules M are connected in parallel with one another by means of a pair of second wiring apparatuses 26. A connector 28b is attached to the distal end of each of a pair of output lines 26b that protrude from the module unit MN. The connector 28b functions as an output terminal of the module unit MN. In this parallel connection, the connectors 22a and 23a of each module M and the connectors 28a and 28c of the wiring apparatuses 26 are removably connected to one another by mating.

In the module unit MN shown in FIG. 7, the six modules M are connected in parallel and series with one another by means of a pair of wiring apparatuses 27 for parallel connection and three connecting wires 24 for series connection. A connector 28b is attached to the distal end of each wiring apparatus 27 that protrudes from the module unit MN. The connector 28b functions as an output terminal of the module unit MN. In this series-parallel connection (FIG. 7), the connectors 22a and 23a of each module M, connectors 24a of the connecting wires 24, and connectors 28a and 28c of the wiring apparatuses 27 are removably connected to one another by mating.

The wiring structure of each of the modules M shown in FIGS. 4 to 7 are suitably selected according to a desired power generation, and the series connection, parallel connection, and series-parallel connection may be combined. Since the connectors can be connected and disconnected, as mentioned later, the modules M can be increased in number, replaced, or connected in different ways after they are set on the building.

FIGS. 8A to 8D, 9A and 9B show single-core wiring apparatuses 16 and 17. The apparatuses 16 and 17, which connect module units MN electrically to one another, are used as output lines for fetching the output of the photovoltaic panel 15. The wiring apparatuses 16 and 17 may be also used as the wiring apparatuses 25 to 27 shown in FIGS. 5 to 7.

Figure 9A:
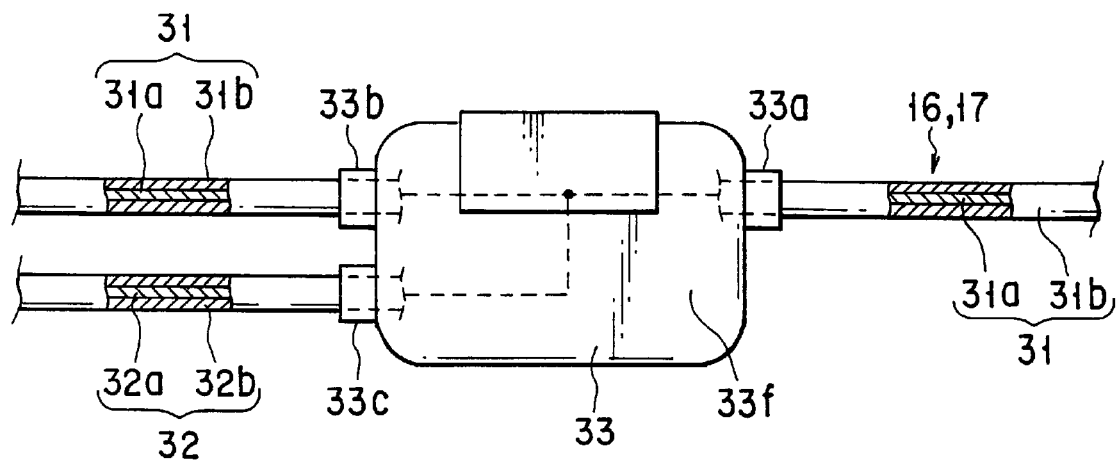
FIG. 9A is a side view, partially in section, showing a branch junction of the wiring apparatus shown in FIG. 8A.

The one wiring apparatus 16 serves for a negative electrode, for example. The apparatus 16 comprises one trunk cable 31 and a plurality of branch cables 32. As shown in FIG. 9A, the trunk cable 31 is composed of an insulated wire that includes a trunk conductor 31a for conducting the output of the module unit MN and a protective sheath 31b externally covering the conductor 31a. The branch cable 32 is composed of an insulated wire that includes a branch conductor 32a for conducting the output of the module unit MN and a protective sheath 32b externally covering the conductor 32a. Distribution cables or mobile cables may be used as the cables 31 and 32. Available distribution cables include cross-linked polyethylene cables, such as CV (cross-linked-polyethylene-insulated vinyl sheath) cables, CE (cross-linked-polyethylene-insulated polyethylene sheath) cables, etc. Vinyl-insulated vinyl sheath cables may be given as alternative polyethylene cables. VCT (vinyl-insulated cabtyre) cables or the like may be used as the mobile cables. In these cables, the protective sheaths 31b and 32b are formed of vinyl or polyethylene sheaths.

Figure 9B:
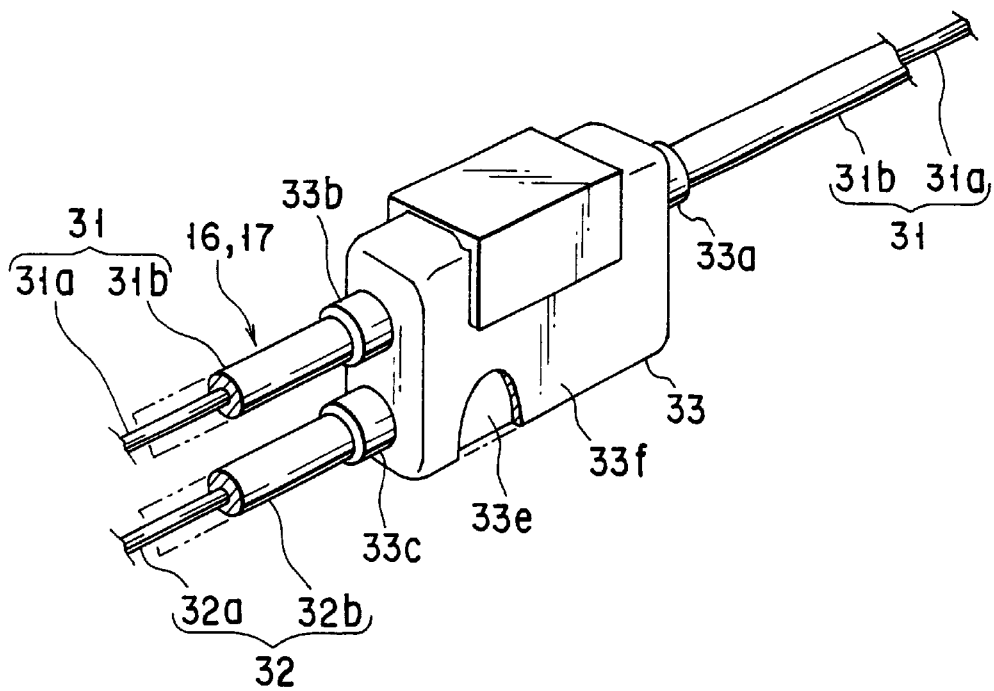
FIG. 9B is a perspective view, partially in section, showing the branch junction of the wiring apparatus shown in FIG. 8A.

A plurality of branch junctions 33 are attached individually to longitudinally intermediate portions of the trunk cable 31. As shown in FIGS. 9A and 9B, each junction 33 includes a molded body 33e of an electrically insulating synthetic resin material and a cover member 33f that covers the outer surface of the body 33e. A cylindrical trunk cable connecting portion 33a protrudes integrally from one end face of the cover member 33f. A cylindrical trunk cable connecting portion 33b and a branch cable connecting portion 33c protrude integrally from the other end face of the cover member 33f. The trunk cable 31 is inserted in each of the trunk cable connecting portions 33a and 33b. One end portion of the branch cable 32 is inserted in the branch cable connecting portion 33c. In each branch junction 33, the trunk conductor 31a and the branch conductor 32a are connected electrically to each other.

The protective sheath 31b of the trunk cable 31 is formed integrally with each branch junction 33 in a manner such that the portions that are inserted in the cable connecting portions 33a and 33b are thermowelded to the cover member 33f. The protective sheath 32b of the branch cable 32 is formed integrally with each branch junction 33 in a manner such that the portion that is inserted in the cable connecting portion 33c is thermowelded to the cover member 33f. In order to form the cover member 33f integrally with the connecting portions 33a, 33b and 33c, it is advisable to use electrical insulating materials of the same kind for the member 33f and the protective sheaths 31b and 32b. More specifically, the cover member 33f and the sheaths 31b and 32b should be formed of insulating materials that are melted to each other by heating, or preferably highly fusible materials, or most preferably the same thermoplastic electrical insulating material. In the case of the first embodiment that uses the protective sheaths 31b and 32b of vinyl, for example, non-crosslinked polyethylene is used as the insulating material for the cover member 33f. In a desired case, the protective sheaths 31b and 32b of the cables 31 and 32 may be formed of a self-extinguishing flame-retardant material, such as soft PVC (polyvinyl chloride) or flame-retardant polyethylene. In this case, the wiring apparatuses 16 and 17 are flame-retardant. If the protective sheaths 31b and 32b of the cables 31 and 32 and the cover member 33f are formed of CE and flame-retardant polyethylene, respectively, the wiring apparatuses 16 and 17 are products that contain no vinyl chloride.

Since the cable connecting portions 33a to 33c of each branch junction 33 are thin-walled, they have some flexibility. This flexibility prevents excessive stress from acting on the cable connecting portions 33a to 33c of the cables 31 and 32, so that the portions 33a to 33c hardly snap compared with a rigid and fragile one. The body 33e of each branch junction 33 and other principal parts than the cable connecting portions 33a to 33c are rigid.

Figure 8A:
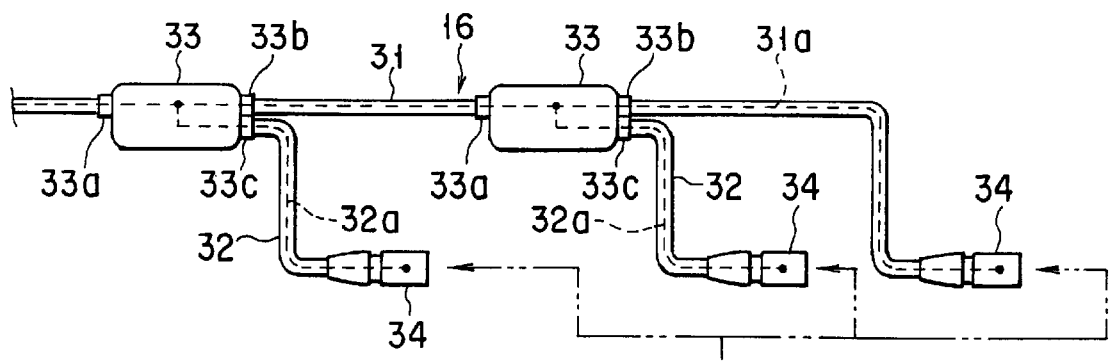
FIG. 8A is a partial side view of a wiring apparatus for negative electrode used in the generation system according to the first embodiment.
Figure 8B:
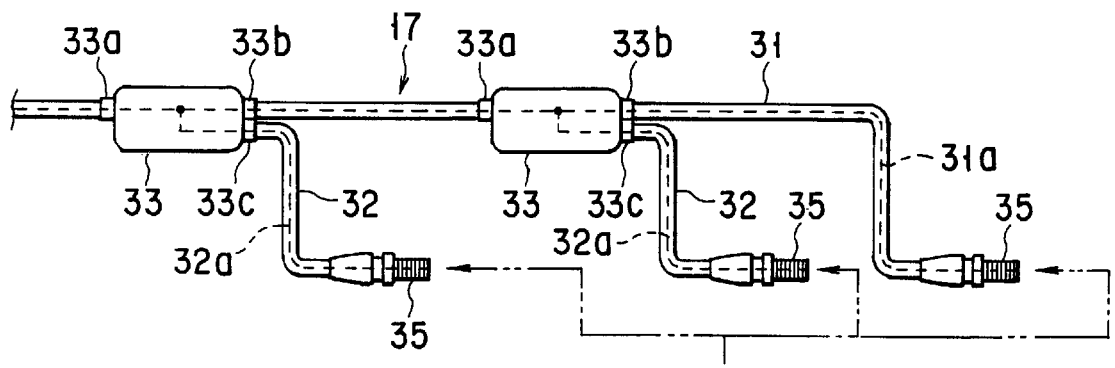
FIG. 8B is a partial side view of a wiring apparatus for positive electrode used in the generation system according to the first embodiment.
Figure 8C:
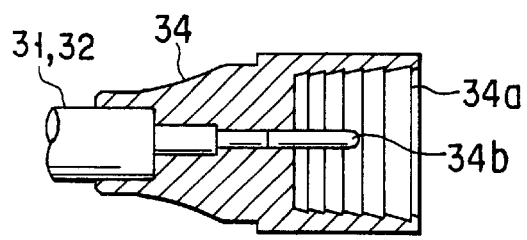
FIG. 8C is a sectional view of a connector of the wiring apparatus for negative electrode shown in FIG. 8A.

As shown in FIG. 8A, connectors 34 are attached individually to at least one end, or preferably two opposite ends, of the trunk cable 31 and the respective distal ends of the branch cables 32 that diverge individually from the branch junctions 33. The connectors 34 have the same construction and are arranged in the manner shown in FIG. 8C, for example. A connecting hole 34a is formed in each connector 34, and a plug-shaped male terminal 34b is located in the central portion of the hole 34a. Stepped indentations are formed on the inner peripheral surface of the connecting hole 34a, escalating in the axial direction of the hole 34a.

Figure 8D:
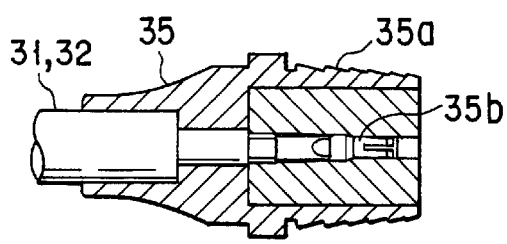
FIG. 8D is a sectional view of a connector of the wiring apparatus for positive electrode shown in FIG. 8B.

Since the other wiring apparatus 17 for positive electrode is arranged in the same manner as the wiring apparatus 16 except for the use of the connectors 34, common reference numerals are used to designate common portions throughout the drawings for simplicity of illustration. Connectors 35 are attached individually to at least one end of the trunk cable 31 of the apparatus 17 and the respective distal ends of the branch cables 32. As shown in FIG. 8D, for example, each connector 35 has a receptacle-shaped female terminal 35b in the central portion of an insert portion 35a. Indentations corresponding in shape to the indentations of the connecting hole 34a of each connector 34 are formed on the outer peripheral surface of the insert portion 35a.

The connectors 22a, 23a and 28a to 28c in each module unit MN are constructed in the same manner as either of the connectors 34 and 35. The connectors 34 and 35 can be removably fitted with each other by mating. As the connectors 34 and 35 are fitted in this manner, their respective terminals 34b and 35b are connected electrically to each other.

As shown in FIG. 3, the two lead-in wires 18 are used for positive and negative electrodes. A branch junction 36 is provided on the outdoor-side end portion of each lead-in wire 18. Each branch junction 36 is provided with a plurality of (e.g., a pair of) outgoing branch lines 36a. Each outgoing line 36a has a connector 36b on its distal end. The connector 34 or 35 is removably connected to each connector 36b by mating.

As shown in FIG. 3, the eight module units MN, which are arranged to constitute an array, are connected in parallel with the two lead-in wires 18 by means of two pairs of wiring apparatuses 16 and 17. Each four adjacent module units MN are connected by means of each corresponding pair of wiring apparatuses 16 and 17. The connectors 34 that are attached to the respective distal ends of the trunk cables 31 of the wiring apparatuses 16 for negative electrode, out of the wiring apparatuses 16 and 17, and the connectors 34 that are attached to the respective distal ends of the branch cables 32 are connected individually to the connectors 24a for negative-electrode of each four adjacent module units MN by mating. In the parallel-connected or series-parallel-connected module units MN shown in FIGS. 5 to 7, these connectors 34 are connected to their corresponding connectors 28b. As shown in FIG. 3, the connectors 35 that are attached to the respective distal ends of the trunk cables 31 of the wiring apparatuses 17 for positive-electrode and the connectors 35 that are attached to the respective distal ends of the branch cables 32 are connected individually to the connectors 24a for positive-electrode of the four adjacent module units MN by mating. In the parallel-connected or series-parallel-connected module units MN shown in FIGS. 5 to 7, these connectors 35 are connected to their corresponding connectors 28b. Like the aforesaid wiring apparatuses 16 and 17, the ones used in the other four module units MN are connected to their corresponding connectors 24a and the like. The connectors 34 that are attached to the respective other ends of the trunk cables 31 of the two wiring apparatuses 16 for negative electrode are connected individually to the connectors 36b of the one lead-in wire 18 by mating. Likewise, the connectors 35 that are attached to the respective other ends of the trunk cables 31 of the two wiring apparatuses 17 for positive electrode are connected individually to the connectors 36b of the other lead-in wire 18 by mating. In doing this, the wiring apparatuses 16 and 17 may be connected to the module units MN after they are connected to the lead-in wires 18. By doing this, the eight module units MN can be connected in parallel with one another. In FIG. 3, each trunk cable 31 is represented by a thick line and each branch cable 32 by a fine line.

Since the respective output terminals of the module units MN are connected to one another by means of the wiring apparatuses 16 and 17 that include the trunk cable 31 and the branch cables 32 each, rough wiring work for the apparatuses 16 and 17 can be carried out before the module units MN are set on a roof or the like. When the module units MN are set on the roof or the like after the wiring work, the wiring apparatuses 16 and 17 can be connected to the module units MN. Accordingly, wiring operation can be executed safely and easily on a roof or some other high place. Since the wiring apparatuses 16 and 17 can be connected at a stroke by means of the mating connectors, in particular, the wiring operation can be easily achieved without requiring any laborious connecting operation, such as soldering. Since the mating connectors are used as connecting structures, moreover, there is no possibility of connection between male connectors or between female connectors, so that misconnection can be avoided.

In the aforesaid wiring structure, the respective trunk cables 31 of the wiring apparatuses 16 and 17 serve as common wiring members for the individual module units MN. Each branch cable 32 is expected to have only a short length ranging from its corresponding trunk cable 31 to the output terminal of a module unit MN. Thus, the necessary number of electric wires and other wiring members for the entire photovoltaic generation system 12 can be reduced, so that the laying efficiency can be improved. Further, the parallel connection based on the wiring apparatuses 16 and 17 requires use of the only two lead-in wires 18 that extend from the photovoltaic panel 15 into the house. Accordingly, laying of the generation system 12 on the roof 11a or the like, involving the wiring work, can be carried out very easily. Since the wiring structure requires the only two lead-in wires 18, moreover, the possibility of wrong wiring is lowered, and only a small hole for the lead-in wires should be bored through a wall of the building. Thus, the building can be easily sealed against rainwater and the like.

In the wiring structure of FIG. 3 that includes the wiring apparatuses 16 and 17, the trunk cables 31 may be arranged so as to double as lead-in wires 18. In this case, the trunk cables 31 of the wiring apparatuses 16 and 17 connected to the module unit MN are extended into a housing, and the extended portions of the trunk cables 31 are used as lead-in wires 18. If the trunk cables 31 have a branch junction 33, they can be used in place of the branch junctions 36 which have branch lines 36a described above. According to this arrangement, the number of connectors used is reduced, so that the connectors can be connected with less time and labor. Since only the trunk cables 31 are needed as the wiring members that extend from the photovoltaic panel 15 into the house, moreover, the wiring work is easier.

In the maintenance of the photovoltaic modules M, the module units MN as objects of maintenance can be separated from the wiring apparatuses 16 and 17 by disengaging the connectors 34 and 35 from themselves. Thus, the maintainability of the modules M can be improved.

In the wiring apparatuses 16 and 17, the protective sheaths 31b and 32b of the cables 31 and 32 and the cover members 33f of the branch junctions 33 are formed of the same material. Accordingly, the cable connecting portions 33a to 33c (shown in FIG. 8A) and the protective sheaths 31b and 32b of the cables 31 and 32 connected thereto can be satisfactorily thermowelded to one another. In this case, there is no possibility of the connecting portions 33a to 33c and the sheaths 31b and 32b being separated from one another. Even though the branch junctions 33 are located outdoors, therefore, it is so water-resistant that the reliability of the wiring apparatuses 16 and 17 to resist penetration of water can be improved.

The modules M that use amorphous cells generate a lower voltage than one generated by modules that use crystalline cells. In the photovoltaic panel 15 of the first embodiment described above, the modules M that constitute each module unit MN are connected in series, and the module units MN are connected in parallel with one another by means of the wiring apparatuses 16 and 17. According to this photovoltaic panel 15, a desired voltage can be generated in accordance with the number of series-connected modules M used, and a desired current can be obtained with use of the parallel-connected module units MN. Thus, desired or necessary electric power for use as power supply can be obtained by selecting the numbers of modules M and module units MN. If the module units MN with the parallel-connected or series-parallel-connected wiring structure shown in FIGS. 5 to 7 are combined as required, moreover, voltage and current can be obtained corresponding to the wiring structure, and a desired photovoltaic source can be obtained.

Figure 10:
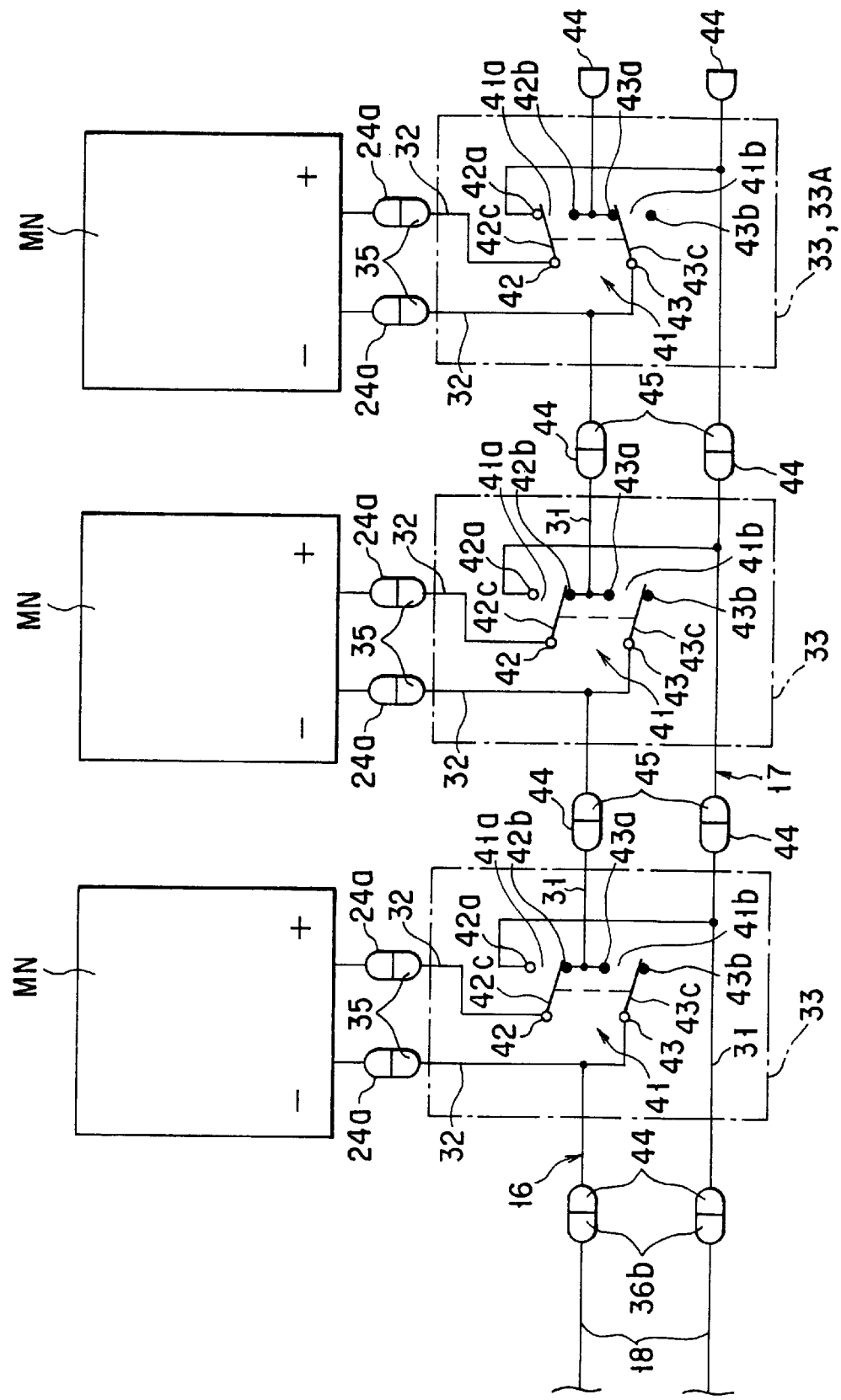
FIG. 10 is a circuit diagram showing a state in which module units of a photovoltaic generation system according to a second embodiment of the invention are connected in series with one another.
Figure 11:
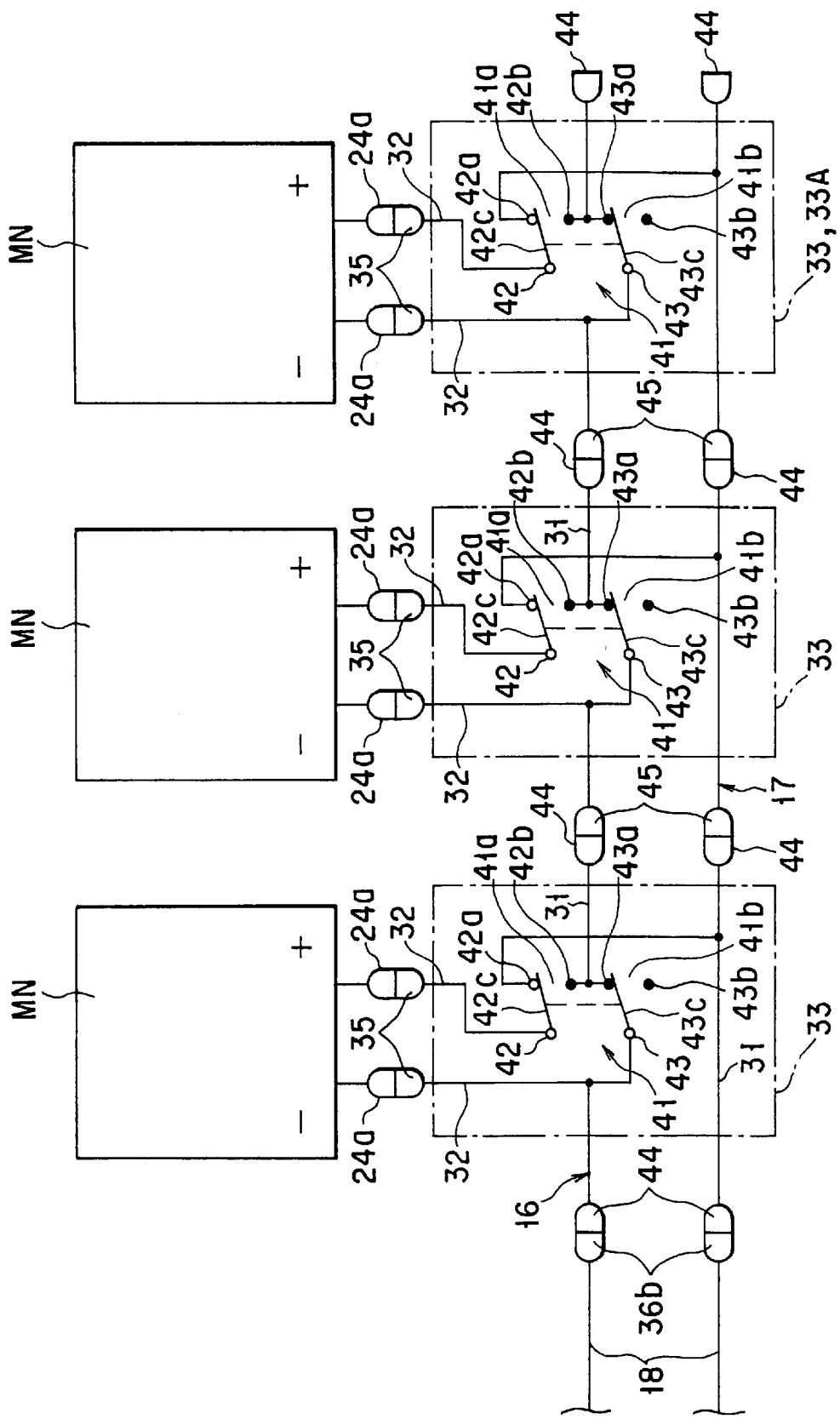
FIG. 11 is a circuit diagram showing a state in which the module units of the system shown in FIG. 10 are connected in parallel with one another.

FIGS. 10 and 11 are circuit diagrams illustrating a second embodiment of the present invention. The second embodiment differs from the first embodiment in that each branch junction 33 is provided with a switch 41 for use as circuit changing means. The circuit changing switch 41 is designed so that it can switch the electrical connection between the module units MN to either of the series- and parallel-connection modes. For other components, the second embodiment is constructed in the same manner as the first embodiment, so that common reference numerals are used to designate common portions of the two embodiments throughout the drawings for simplicity of illustration. The following is a description of the circuit changing switch 41. A pair of two-core wiring apparatuses 16 and 17 are used according to the second embodiment. The wiring apparatuses 16 and 17 may be used to connect the modules M in place of the module units MN.

The wiring apparatuses 16 and 17 according to the second embodiment, which extend parallel to each other, are united together to constitute one two-core wiring apparatus, apparently. A plurality of branch junctions 33 are attached to longitudinally intermediate portions of the wiring apparatuses 16 and 17. Each branch junction 33 incorporates a two-throw circuit changing switch 41, which serves as circuit changing means. The switch 41 includes first and second switch sections 41a and 41b, which are interlocked to perform circuit changing operation. A switch operating member (not shown) for shifting the switch 41 is exposed in the outer surface of the branch junction 33. The switch operating member shifts the circuit changing switch 41 as it is manually actuated by sliding or snapping operation.

The first switch section 41a is composed of a common contact 42, contact 42a for parallel connection, contact 42b for series connection, movable contact 42c, etc. Likewise, the second switch section 41b is composed of a common contact 43, contact 43a for parallel connection, contact 43b for series connection, movable contact 43c, etc. The movable contacts 42c and 43c are activated in association with the switch operating member.

The series-connection contact 42b of the first switch section 41a is connected to the parallel-connection contact 43a of the second switch section 41b. The trunk cable 31 of the one wiring apparatus 16 is connected to the contacts 42b and 43a. The trunk cable 31 of the apparatus 16 and one branch cable 32 are connected to the common contact 43 of the second switch section 41b. The parallel-connection contact 42a of the first switch section 41a is connected to the trunk cable 31 of the other wiring apparatus 17. The other branch cable 32 is connected to the common contact 42 of the first switch section 41a.

Connectors 44 and 45 shown in FIGS. 10 and 11 are mating-type connectors that can be attached to and detached from one another. The connectors 44 and 45 are used to attach and detach the trunk cables 31 between the branch junctions 33. For other components, the second embodiment is constructed in the same manner as the first embodiment.

FIG. 10 shows a state in which the module units MN according to the second embodiment are connected in series with one another. In this state of connection, the movable contacts 42c and 43c of the switch sections 41a and 41b are in contact with their corresponding series-connection contacts 42b and 43b in all the branch junctions 33 except a final branch junction 33A at the end remoter from the lead-in wires 18. In the final branch junction 33A, the movable contacts 42c and 43c are in contact with their corresponding parallel-connection contacts 42a and 43a. Thus, all the module units MN are connected in series with one another.

FIG. 11 shows a state in which the module units MN are connected in parallel with one another. In this state of parallel connection, the movable contacts 42c and 43c of the switch sections 41a and 41b are in contact with their corresponding parallel-connection contacts 42a and 43a in all the branch junctions 33. Thus, all the module units MN are connected in parallel with one another.

In the photovoltaic generation system that comprises the two-core wiring apparatuses 16 and 17 and the circuit changing switch 41 described above, the module units MN (or modules M) can be connected in series or parallel with one another by operating the respective circuit changing switches 41 of the branch junctions 33 as required at the scene of laying. Thus, the wiring apparatuses 16 and 17 can be used in common for both the series and parallel connections between the module units MN or modules M.

Accordingly, wiring apparatuses need not be produced separately for series and parallel connections, so that the productivity of the wiring apparatuses can be improved. Besides, the module units MN can be connected in series or parallel with one another by operating the circuit changing switches 41 as required at the scene of laying, so that prearrangement for laying operation and the laying efficiency can be improved. In adding some extension module units MN or modules M to the system or in some other cases, moreover, the resulting modification of wire arrangement can be tackled with ease. Maintenance of the system is easy for the same reason. For other functions and effects than those described above, the second embodiment resembles the first embodiment, so that a repeated description will be omitted.

Figure 12:
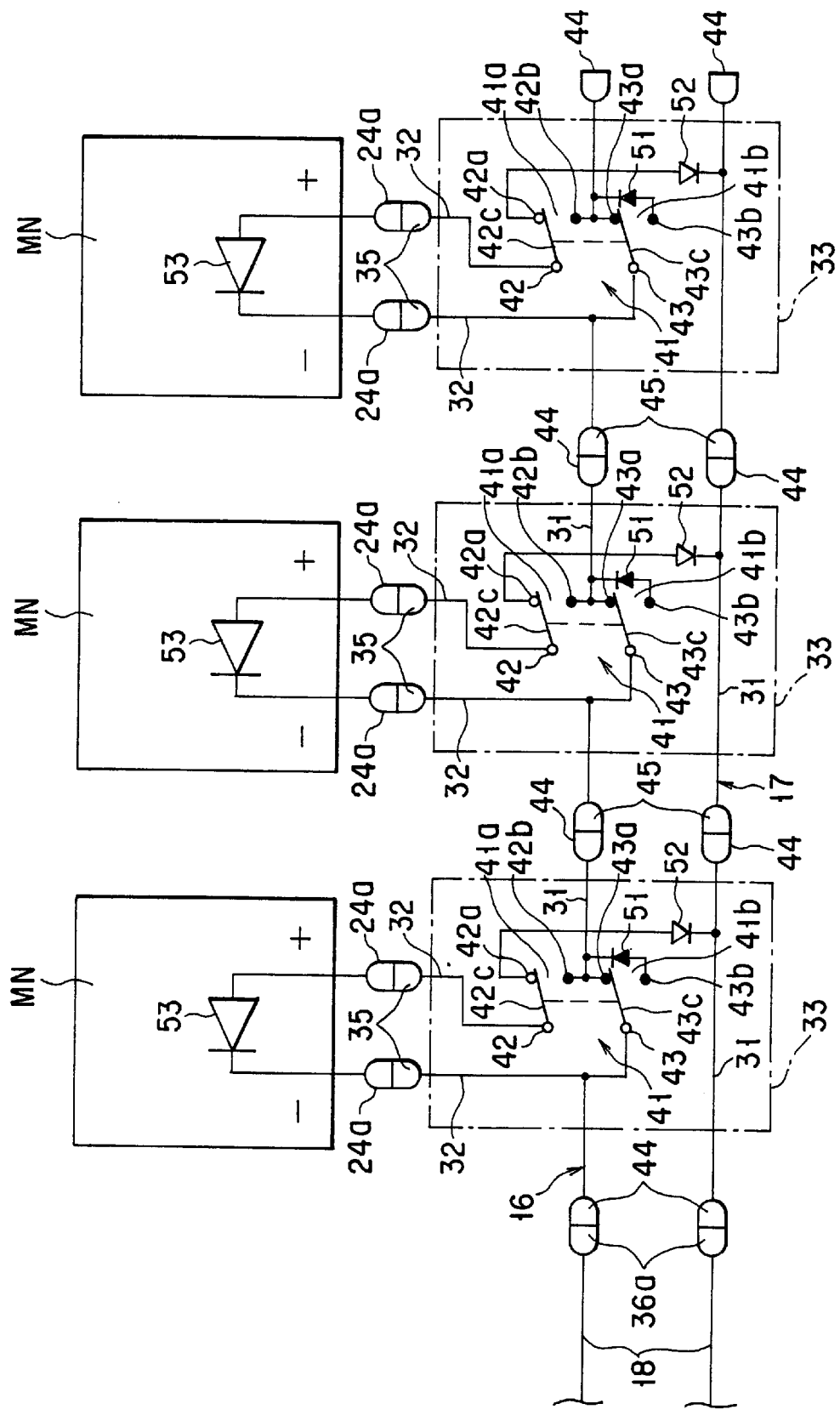
FIG. 12 is a circuit diagram showing the way of connection between module units of a photovoltaic generation system according to a third embodiment of the invention.

FIG. 12 is a circuit diagram showing a third embodiment of the present invention. The third embodiment differs from the second embodiment in that the system is provided with bypass diodes 51 for the maintenance of output and check diodes 52. Diodes 53 are components of photovoltaic cells. For other components, the third embodiment is constructed in the same manner as the second embodiment, so that common reference numerals are used to designate common portions of the two embodiments throughout the drawings for simplicity of illustration. The following is a description of the diodes 51 and 52.

In each of branch junctions 33, the bypass diode 51 is situated between a series-connection contact 43b of the second switch section 41b and the trunk cable 31 that is connected to a parallel-connection contact 43a. The diode 51 is connected to the series-connection contact 43b so that its polarity is directed in the manner shown in FIG. 12. In this case, a bypass circuit including the bypass diodes 51 is formed in parallel with a plurality of module units MN or modules M when movable contacts 43c are brought into contact with their corresponding series-connection contacts 43b to connect the module units MN or modules M in series with one another. Thus, the bypass circuit is turned on when circuit changing switches 41 are in the series-connection mode. When the switches 41 are shifted to the parallel-connection mode, the bypass circuit is turned off.

If some of the module units MN or modules M are shaded or broken when they are connected in series with one another, therefore, the respective outputs of the remaining normal module units MN or modules M can be fetched from lead-in wires 18 via the bypass circuit. Thus, the outputs of the normally operating module units MN or modules M can be fetched without being damaged.

In each branch junction 33, the first check diode 52 is located between a parallel-connection contact 42a of the first switch section 41a and the trunk cable 31 of a wiring apparatus 17 for positive electrode so that its polarity is directed in the manner shown in FIG. 12. The diodes 52 function when their corresponding circuit changing switches 41 are shifted to the parallel-connection mode so that the module units MN or modules M are connected in parallel. When the module units MN or modules M are connected in parallel with one another, the diodes 52 prevent current that flows through the wiring apparatus 17 for positive electrode from flowing back into the module units MN or modules M via the first switch sections 41a.

If some of the module units MN or modules M in a photovoltaic generation system are shaded or broken, their outputs sometimes may be reduced to zero or below those of the remaining normal module units MN or modules M. If the module units MN or modules M are connected in parallel without the use of check diodes in this case, the output currents of high-output module units or modules flow back into low-output (or zero-output) module units or modules through the wiring apparatuses, so that the output sometimes cannot be fetched normally. According to the photovoltaic generation system of the third embodiment that is provided with the check diodes 52, however, the general output of the system can be fetched securely without damaging the respective outputs of the normally operating module units MN or modules M. For other functions and effects than those described above, the third embodiment resembles the second embodiment, so that a repeated description will be omitted. Although each check diode 52 is located in a circuit for positive-electrode according to the third embodiment, it may alternatively be located in a circuit for negative-electrode.

FIGS. 13 to 17B show a fourth embodiment of the present invention. According to the fourth embodiment, a plurality of modules M or module units MN are connected in parallel with one another by means of multi-core (more specifically, two-core) wiring apparatuses 19 and 20. The respective output terminals of the modules M or module units MN and the wiring apparatuses 19 and 20 are connected directly to one another by means of connectors. For other components, the fourth embodiment is constructed in the same manner as the first embodiment, so that common reference numerals are used to designate common portions of the two embodiments throughout the drawings for simplicity of illustration. The following is a description of differences from the first embodiment.

FIGS. 15A to 15E show a terminal box 21. The terminal box 21 includes a body 61 fixed to the back surface of each module M, a lid 62 covering an opening of the body 61, and a pair of metallic connecting terminals 63. The body 61 and the lid 62 are formed of an electrical insulating material each. The lid 62 is fixed to the body 61 in a manner such that part of it is anchored to hook portions on the body 61. A fitting protrusion 64 protrudes outward from the central portion of one end face of the body 61. A pair of apertures 65 are formed in the body 61, opening on the back side of the module M. A circumferentially continuous engaging groove 64a is formed on the outer surface of the fitting protrusion 64.

The connecting terminals 63 are mounted in the body 61. A connecting pin 66 is formed on one end portion of each connecting terminal 63. The pins 66 project outward from the fitting protrusion 64 in parallel relation. The two connecting pins 66 serve as output terminals of each module M. The other end portion of each connecting terminal 63, which faces each corresponding aperture 65, is formed having a connecting groove 67. Output lines of the module M that are led into the terminal box 21 are anchored to the connecting grooves 67, individually. The output lines are connected to their corresponding terminals 63 by soldering or the like. The output lines and the terminals 63 are connected not at the scene of installation of the photovoltaic panel 15 on the roof but in a manufacturing process for the panel 15. If each terminal 63 requires connection of a plurality of output lines, it should only be provided with a plurality of connecting grooves 67.

The lid 62 has an insert guide tube portion 62a on its one end. The guide tube portion 62a surrounds the fitting protrusion 64 and the two connecting pins 66. A connector 71 for insertion (mentioned later) can be inserted into the tube portion 62a. The tube portion 62a protects the fitting protrusion 64 and connecting pins 66, and keeps their water proofing.

Figure 16:
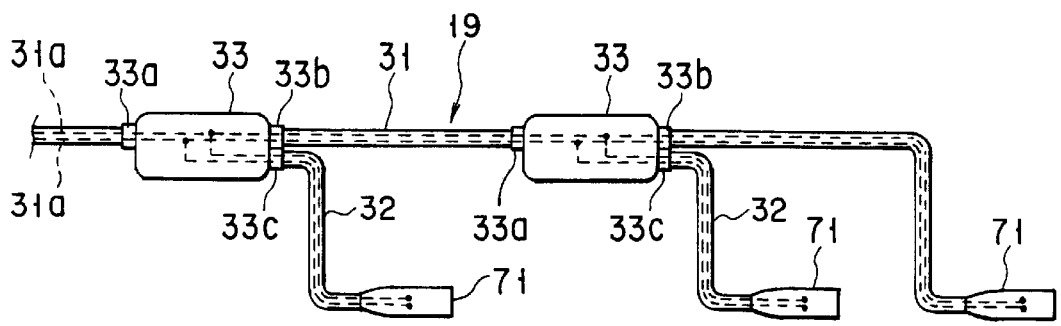
FIG. 16 is a partial side view of a wiring apparatus used in the system according to the fourth embodiment.
Figure 17A:
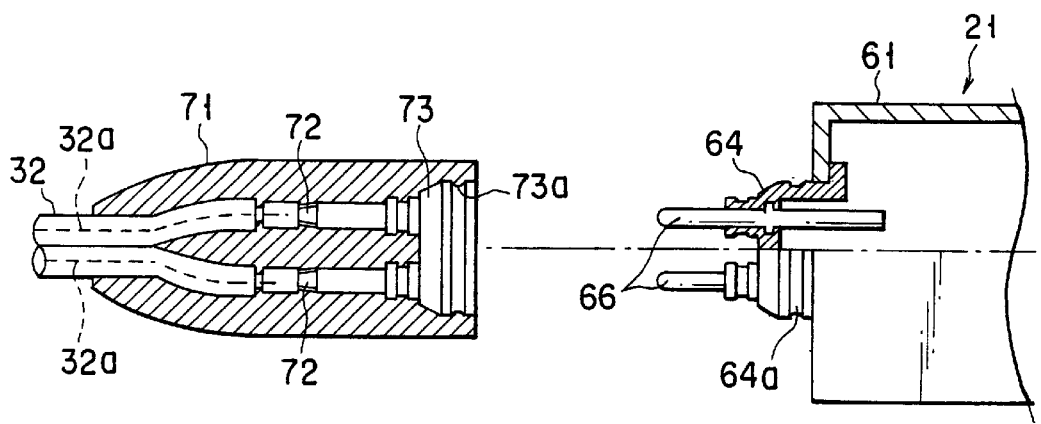
FIG. 17A is a partial plan view, partially in section, showing a connector of the wiring apparatus of FIG. 16 and the terminal box.

FIG. 16 shows a two-core wiring apparatus 19. This wiring apparatus 19 comprises a trunk cable 31 having a pair of trunk conductors 31a, a plurality of branch junctions 33 attached individually to longitudinally intermediate portions of the cable 31, and branch cables 32 diverging from the cable 31 at the branch junctions 33, individually. As shown in FIG. 17A, each branch cable 32 includes a pair of branch conductors 32a. One branch conductor 32a is connected to one trunk conductor 31a in each branch junction 33. The other branch conductor 32a is connected to the other trunk conductor 31a in each branch junction 33. Thus, the branch cables 32 diverge in parallel with one another from the trunk cable 31. Female connectors 71 are connected individually to the opposite ends of the trunk cable 31 and the respective distal ends of the branch cables 32.

Figure 17B:
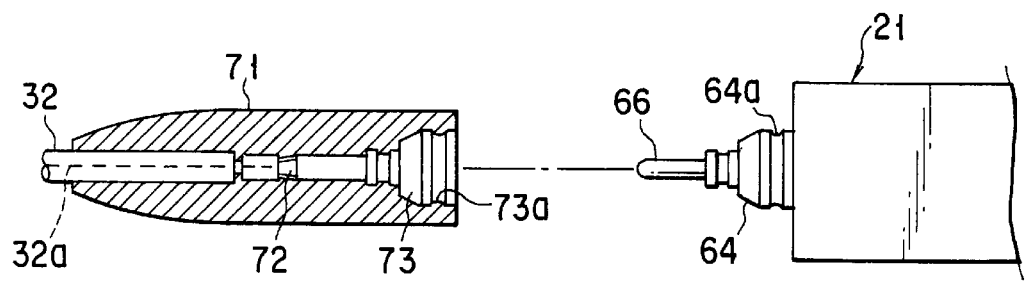
FIG. 17B is a partial side view, partially in section, showing the connector and the terminal box of FIG. 17A.

As shown in FIGS. 17A and 17B for representative illustration, each connector 71 is provided with two receptacle-shaped female connecting terminals 72 that are connected to the two branch conductors 32a, individually. A fitting hole 73 is formed in the connector 71, facing the terminals 72. The hole 73 opens in the distal end face of the connector 71. A circumferentially continuous engaging protrusion 73a is formed on the inner peripheral surface of the fitting hole 73. The female connector 71 is caused to mate with the fitting protrusion 64 in a manner such that it is inserted into the guide tube portion 62a of the terminal box 21 shown in FIG. 15A. As the engaging groove 64a engages the engaging protrusion 73a, the engagement between the terminal box 21 and the connector 71 is maintained, and the connecting pins 66 are connected electrically to their corresponding connecting terminals 72. Since that part of the connector 71 near the engaging protrusion 73a is somewhat transformable, the connecting pins 66 can be disengaged from the connecting terminals 72 by strongly pulling the connector 71 away from the terminal box 21.

Figure 14:
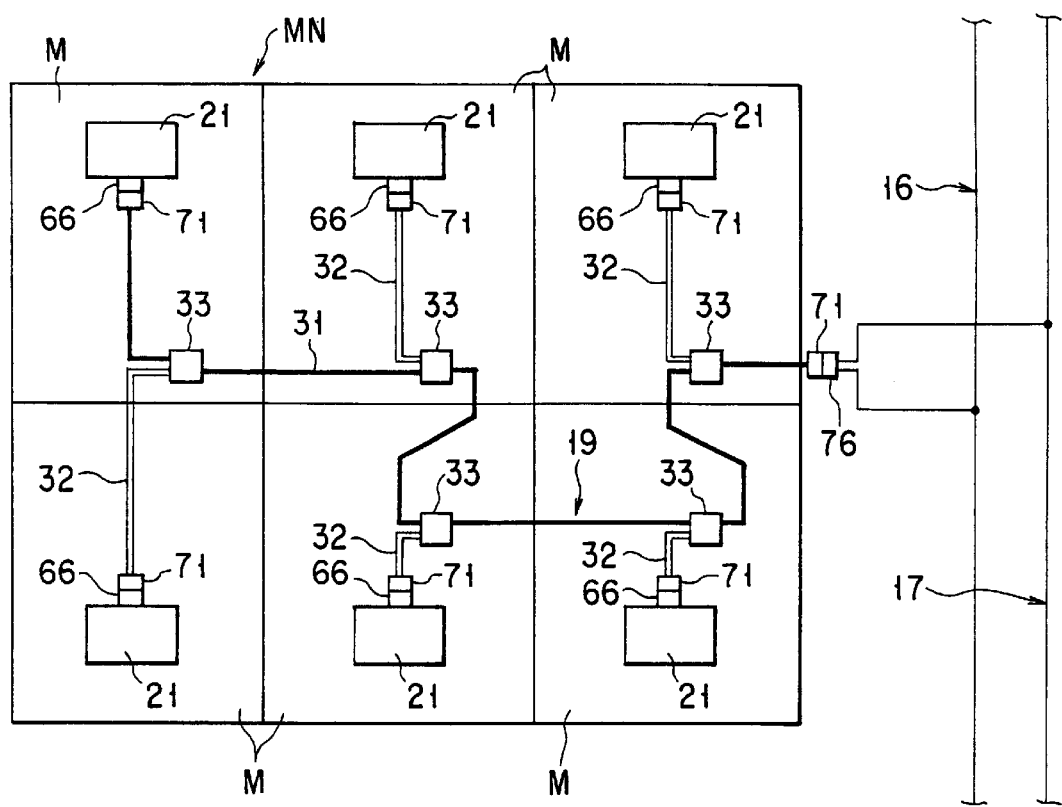
FIG. 14 is a circuit diagram showing a wiring structure in the system according to the fourth embodiment, having photovoltaic modules connected in parallel with one another.
Figure 15A:
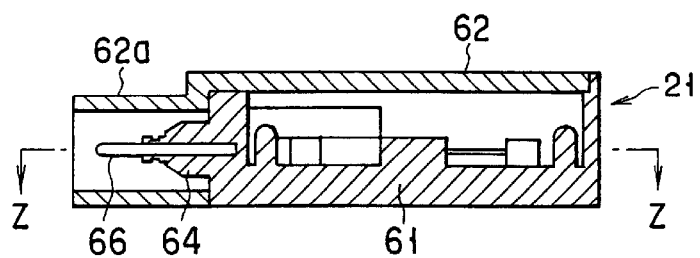
FIG. 15A is a sectional view of a terminal box used in each photovoltaic module of the system according to the fourth embodiment.
Figure 15B:
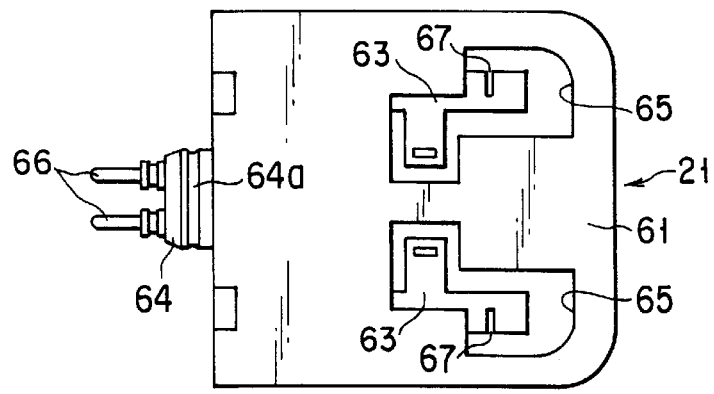
FIG. 15B is a plan view of the terminal box shown in FIG. 15B.
Figure 15C:
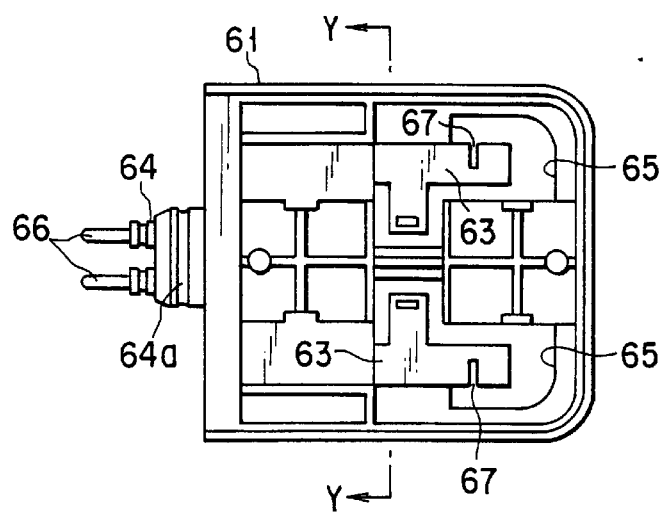
FIG. 15C is a plan view of the terminal box of FIG. 15A with its lid off.
Figure 15D:
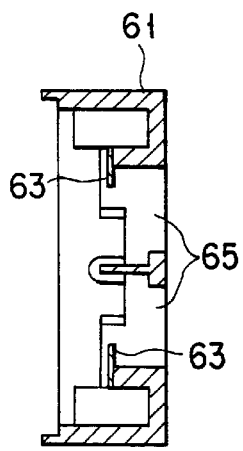
FIG. 15D is a sectional view of a body of the terminal box taken along line Y—Y of FIG. 15C.
Figure 15E:
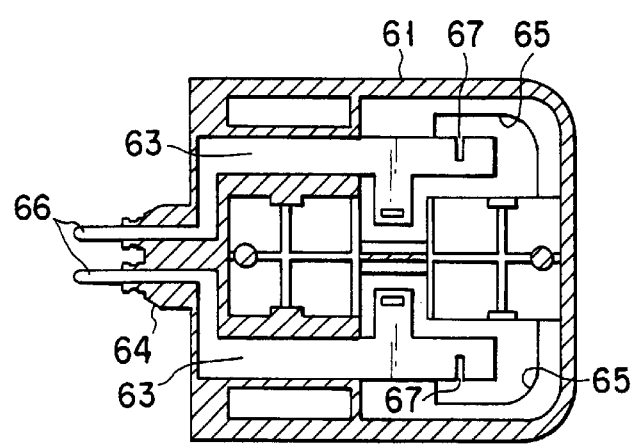
FIG. 15E is a sectional view of the body of the terminal box taken along line Z—Z of FIG. 15A.

FIG. 14 shows a case where a plurality of modules M are connected parallel with one another by means of the two-core wiring apparatus 19. In FIG. 14, a thick line represents the trunk cable 31, while double lines represent the branch cables 32, individually. A connector 76 for two-core cable that is connected to the wiring apparatuses 16 and 17 is removably connected to its corresponding connector 71 by mating.

Figure 13:
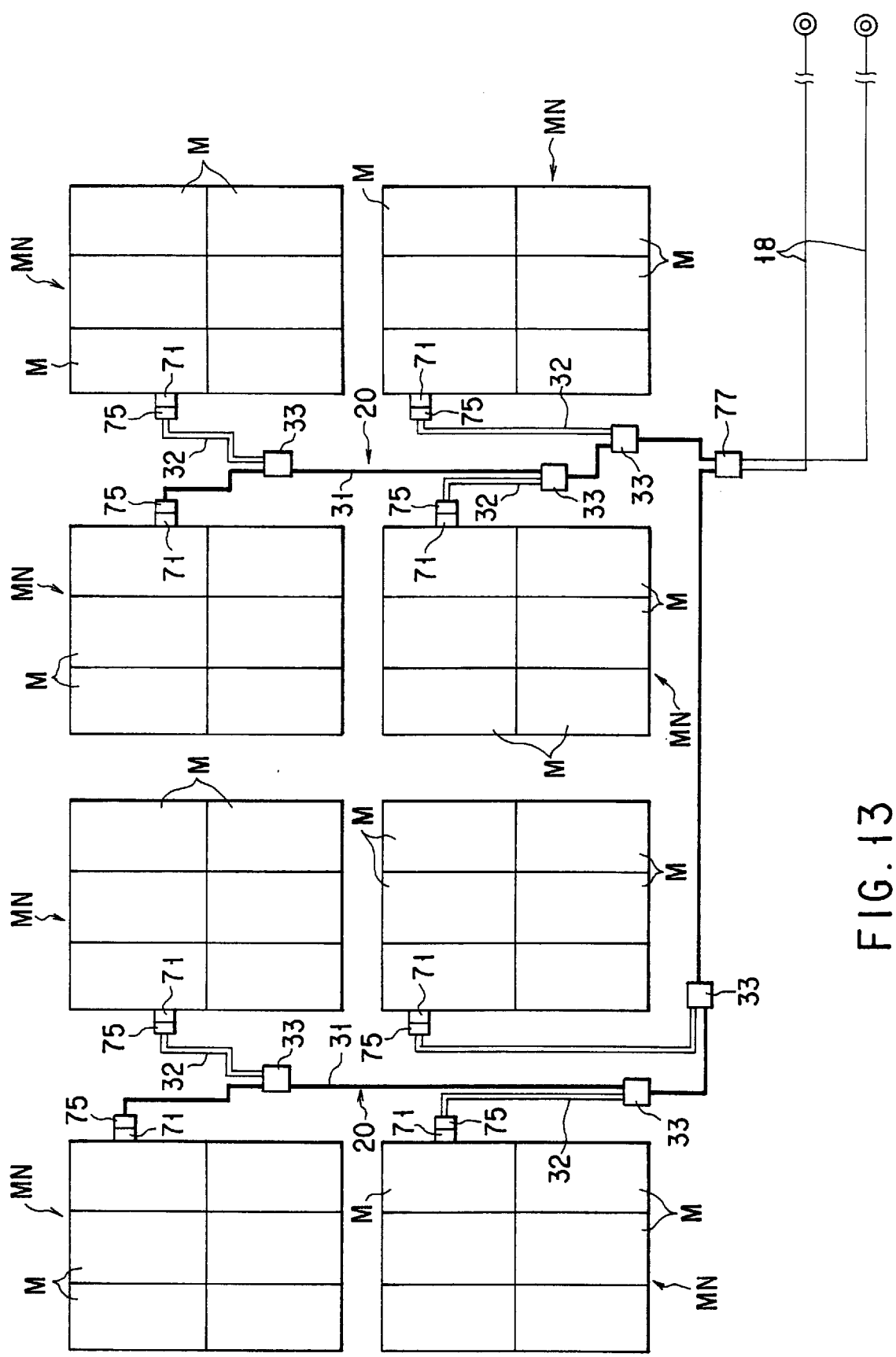
FIG. 13 is a circuit diagram showing a wiring structure for module units of a photovoltaic generation system according to a fourth embodiment of the invention.

FIG. 13 shows another case where the two-core wiring apparatus 20 is used. The wiring apparatus 20 is constructed in the same manner as the wiring apparatus 19 (shown in FIG. 14) except for connectors 75 that are attached individually to the respective distal ends of a trunk cable 31 and branch cables 32. Each connector 75 has a male structure such that it can mate with each corresponding female connector 71. Each connector 75 includes a pair of connecting pins (not shown) that are connected individually to the two terminals 72 of the female connector 71. The male and female connectors are replaceable with one another. If the connectors 71 are of the male type, therefore, the connectors 75 can be of the female type.

FIG. 13 shows the case where a plurality of module units MN are connected in parallel with one another by means of the wiring apparatus 20. In FIG. 13, a thick line represents the trunk cable 31, while double lines represent the branch cables 32, individually. A connector 77 for multi-core cable is provided on lead-in wires 18 shown in FIG. 13. The respective trunk cables 31 of a pair of wiring apparatuses 20 are connected to the connector 77.

Since the wiring apparatuses 19 and 20 according to the fourth embodiment have the two-core structure, the apparent necessary number of cables can be halved to make the wiring structure simpler than in the case where the single-core wiring apparatuses are used. Since the modules M and the wiring apparatuses 19 and 20 are connected by means of the connectors 71 or 75, moreover, laborious connecting operation such as soldering need not be carried out at the scene of installation of the photovoltaic generation system 12. Besides, circuits for positive- and negative-electrode can be connected simultaneously by fitting the male and female connectors with one another, so that labor for the connecting operation can be saved. Thus, the working efficiency for the installation of the photovoltaic generation system can be improved.

For other functions and effects than those described above, the fourth embodiment resembles the second embodiment, so that a repeated description will be omitted. The connectors 71 of the module units MN according to the fourth embodiment are also applicable to the cases of the first embodiment and the like in which the single-core wiring apparatuses are used. Thus, the output lines can be prevented from hanging outside from the ends of the photovoltaic modules.

FIGS. 18A, 18B, 19A and 19B show a fifth embodiment of the present invention. The fifth embodiment differs from the first embodiment in that junction cables 85 for trunk and branch lines are attached as required to branch junctions 33. For other components, the fifth embodiment is constructed in the same manner as the first embodiment, so that common reference numerals are used to designate common portions of the two embodiments throughout the drawings for simplicity of illustration. The following is a description of differences from the first embodiment.

As shown in FIG. 18A, a first cable connecting portion 81 is attached to each end face of each branch junction 33. Adjoining the first cable connecting portion 81, a second cable connecting portion 82 is attached to one end face of each branch junction 33. The two first cable connecting portions 81 are connected to a trunk cable 31, and the second cable connecting portion 82 to its corresponding branch cable 32. The connecting portions 81 and 82 have the same male connector structure of the terminal box 21 described in connection with the fourth embodiment (FIG. 17A), for example. Although the connector shown in FIG. 17A is a two-core connector, connectors according to the fifth embodiment (FIGS. 18A and 18B) are single-core connectors. Instead of male connectors at the cable connecting portions 81 shown in FIG. 18B, connectors that resemble the female connector 71 shown in FIG. 17A may be attached directly to each branch junction 33.

A pair of connectors 83 are attached individually to the opposite ends of the trunk cable 31. One connector 83 is removably connected to one of the first cable connecting portions 81 by mating. A pair of connectors 84 are also attached individually to the opposite ends of each branch cable 32. One connector 84 is removably connected to the second cable connecting portion 82 by mating. The connectors 83 and 84 may be either female or male connectors. In the illustrated case, however, both the first and second cable connecting portions 81 and 82 are of the male type, so that the connectors 83 and 84 are female connectors.

As shown in FIG. 19A, a junction cable 85 may be connected between any of the first cable connecting portions 81 and its corresponding connector 83 on the trunk cable 31, depending on the conditions for the installation of the photovoltaic modules. Depending on the module installation conditions, moreover, a junction cable 85 may be connected between any of the second cable connecting portions 82 and the connector 84 on its corresponding branch cable 32. As shown in FIG. 19B, each junction cable 85 has a first connector 86 on its one end and a second connector 87 on the other end. The first connector 86 is removably connected to the first or second cable connecting portion 81 or 82 by mating. Since the cable connecting portions 81 and 82 are of the male type, the first connector 86 is of the female type. The second connector 87 is removably connected to any connector 83 on the trunk cable 31 or any connector 84 on any branch cable 32 by mating. Since the connectors 83 and 84 are of the female type, the second connector 87, like the cable connecting portions 81 and 82, is of the male type. If a plurality of junction cables 85 are expected to be connected in series with one another, each two cables 85 can be connected in a manner such that the first connector 86 on one cable 85 is made to mate with the second connector 87 on the other cable 85. For other components than those described above, the fifth embodiment is constructed in the same manner as the first embodiment.

With use of the wiring apparatuses 16 and 17 having the aforementioned constructions, the trunk cable 31 can be removably connected to the first cable connecting portions 81 on each branch junction 33 by mating, and any branch cable 32 can be removably connected to any second cable connecting portion 82 by mating. In the maintenance of the photovoltaic modules, therefore, they can be separated from the wiring apparatuses 16 and 17 by disengaging the trunk and branch cables 31 and 32 from the cable connecting portions 81 and 82. Thus, the photovoltaic modules that require maintenance can be separated from the wiring apparatuses 16 and 17, so that the possibility of the apparatuses 16 and 17 hindering the maintenance can be reduced. In consequence, the working efficiency for the maintenance can be improved.

If necessary, moreover, the junction cable 85 can be connected between the first cable connecting portion 81 of each branch junction 33 and the trunk cable 31 to be connected thereto or between the second cable connecting portion 82 and the branch cable 32 to be connected thereto. In this case, the connectors 86 and 87 on the junction cable 85 are connected, respectively, to the cable connecting portion 81 or 82 and the connector 83 or 84 of the trunk cable 31 or the branch cable 32 after the cable 31 or 32 is disengaged from the connecting portion 81 or 82. With use of the junction cable 85, the substantial wiring length of each trunk or branch cable 31 or 32 can be made longer than in the case where no junction cable is used. Thus, depending on the use of junction cables 85 or the number of junction cables 85 used, the respective lengths of the trunk and branch cables 31 and 32 can be adjusted so as to fit the layout or configuration of the photovoltaic modules or module units. Accordingly, the photovoltaic modules can be increased for extension or rearranged with ease. Commercially available cables may be used as the junction cables 85. In this case, there is no necessity for developing new products for the cables 85, so that the cable 85 can be available at low cost. For other functions and effects than those described above, the fifth embodiment resembles the first embodiment, so that a repeated description will be omitted. The fifth embodiment is also applicable to multi-core (e.g., two-core) wiring apparatuses.

Figure 20:
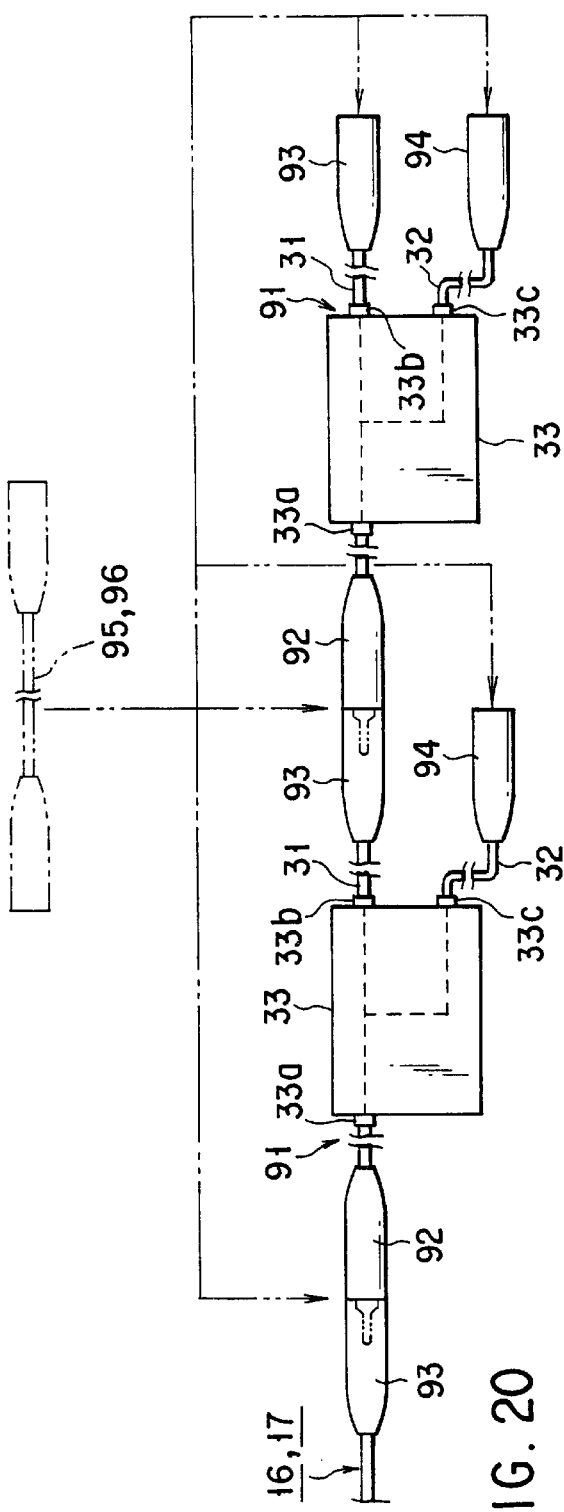
FIG. 20 is a partial side view of a wiring apparatus used in a photovoltaic generation system according to a sixth embodiment of the invention.
Figure 21:
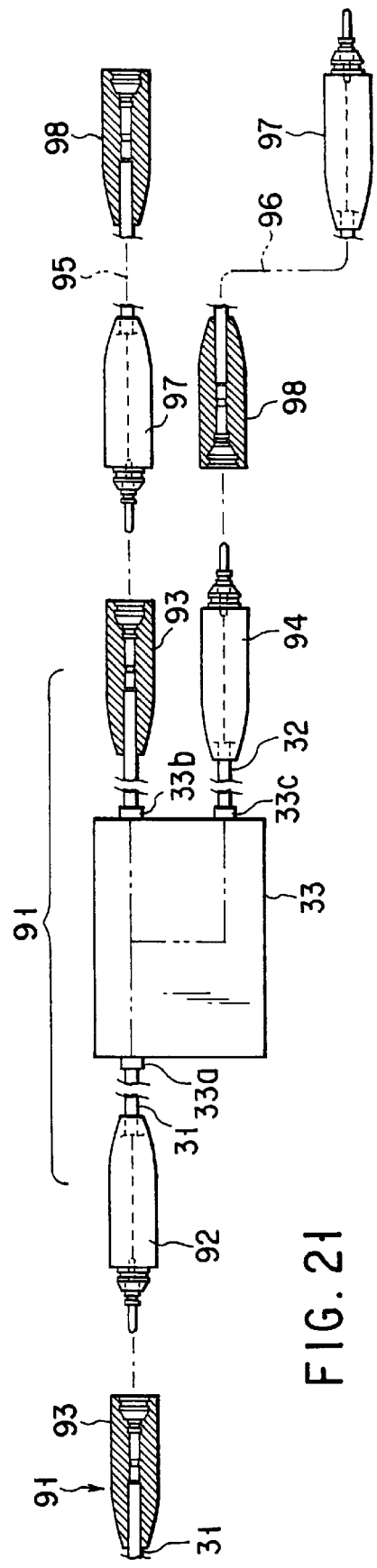
FIG. 21 is a side view, partially in section, showing a wiring unit constituting part of the wiring apparatus shown in FIG. 20 and auxiliary cables.

FIGS. 20 and 21 show a sixth embodiment of the present invention. The sixth embodiment differs from the first embodiment in that an auxiliary trunk cable 95 and an auxiliary branch cable 96 are connected as required to a trunk or branch cable 31 or 32. For other components, the sixth embodiment is constructed in the same manner as the first embodiment, so that common reference numerals are used to designate common portions of the two embodiments throughout the drawings for simplicity of illustration. The following is a description of differences from the first embodiment.

As shown in FIG. 20, a plurality of wiring units 91 are coupled to wiring apparatuses 16 and 17. Each wiring unit 91 includes a trunk cable 31, a branch junction 33 attached to the cable 31, and a branch cable 32 diverging from the branch junction 33. Connectors 92 and 93 are provided on one and the other ends, respectively, of the trunk cable 31. A connector 94 is provided on the distal end of the branch cable 32. The connectors 92 and 93, which are of different types, male or female, can be removably connected to each other by mating. The connector 94 on the branch cable 32 may be of the male or female type, or more specifically, of the same type as one of the connectors 92 and 93. The respective connectors 92 and 93 of the adjacent wiring units 91 are removably connected to one another by mating, thereby forming wiring apparatuses 16 and 17 with a desired length.

Figure 22:
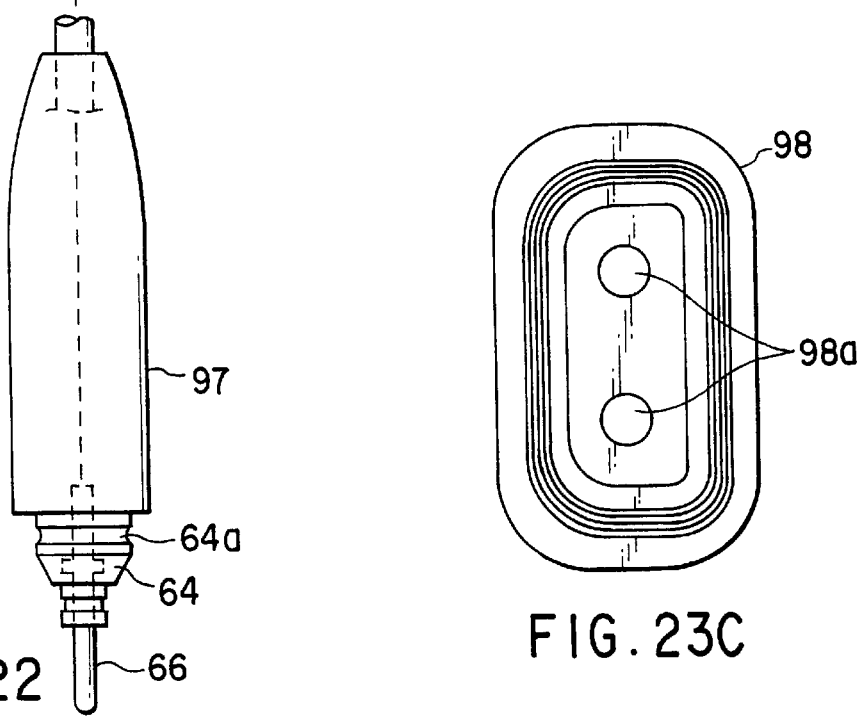
FIG. 22 is a side view, partially in section, showing one of the auxiliary cables of FIG. 21.

FIGS. 21 and 22 show an auxiliary trunk cable 95 and an auxiliary branch cable 96 that are connected as required to one of the wiring units 91. The cables 95 and 96 have the same construction. As shown in detail in FIG. 22, each of the cables 95 and 96 has a first connector 97 of the male type on its one end and a second connector 98 of the female type on the other end. The first connector 97 is removably connected to the female connector 93 by mating. The second connector 98 is removably connected to the male connector 92 or 94 by mating. For other components, the sixth embodiment is constructed in the same manner as the first embodiment.

With use of the wiring apparatuses 16 and 17 that are provided with the wiring units 91, the auxiliary trunk cable 95 or the auxiliary branch cable 96 can be removably connected to the connectors 92, 93 and 94, which are provided on the trunk and branch cables 31 and 32, by mating. The respective connectors 92 and 93 of a plurality of trunk cables 31 can be removably connected to one another by mating. The connector 94 of each branch cable 32 can be also removably connected to another connector by mating. In the maintenance of the photovoltaic modules, therefore, the modules that require maintenance and the wiring units 91 corresponding to the modules can be separated from the wiring apparatuses 16 and 17 by disengaging the connectors 92, 93 and 94 from their fellow connectors. Thus, the photovoltaic modules that require maintenance can be separated from the wiring apparatuses 16 and 17, so that there is no possibility of the apparatuses 16 and 17 hindering the maintenance. In consequence, the working efficiency for the maintenance can be improved.

If necessary, moreover, the auxiliary trunk cables 95 can be connected individually to the respective trunk cables 31 of the wiring units 91 by mating using the connectors 92, 93, 97 and 98. If necessary, furthermore, the auxiliary branch cables 96 can be connected individually to the branch cables 32 by means of the connectors 94, 97 and 98. With use of these auxiliary cables 95 and 96, the substantial wiring lengths of the trunk and branch cables 31 and 32 can be made longer than in the case where no auxiliary cables are used. Thus, depending on the use of the auxiliary cables 96 and 96 or the number of auxiliary cables used, the respective lengths of the trunk and branch cables 31 and 32 can be adjusted so as to fit the layout or configuration of the photovoltaic modules or module units. Accordingly, the photovoltaic modules can be increased for extension or rearranged with ease. Commercially available cables may be used as the auxiliary cables 95 and 96. In this case, there is no necessity for developing new products for the cables 95 and 96, so that the cables 95 and 96 can be available at low cost.

Figure 23A:
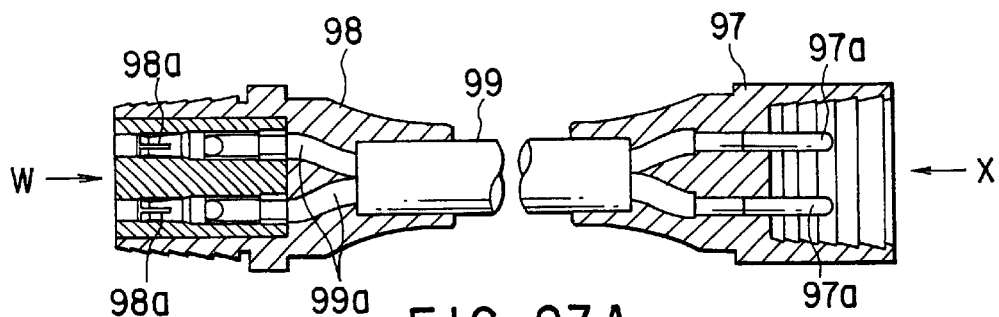
FIG. 23A is a sectional view showing a two-core auxiliary cable used in the system according to the sixth embodiment.
Figure 23B:
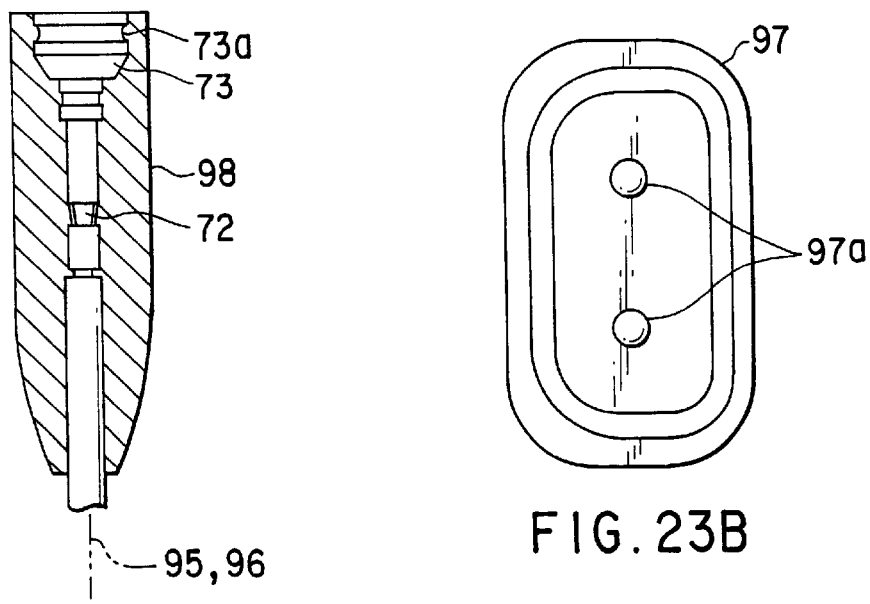
FIG. 23B is a front view of a first connector taken in the direction of arrow X in FIG. 23A.
Figure 23C:
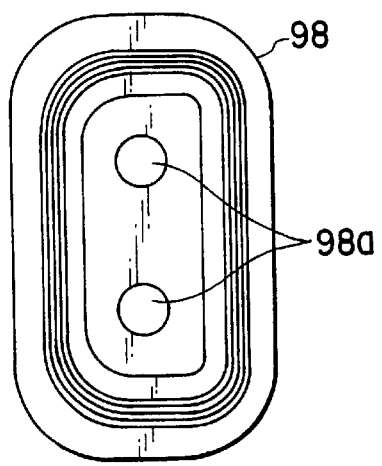
FIG. 23C is a front view of a second connector taken in the direction of arrow W in FIG. 23A.
Figure 24:
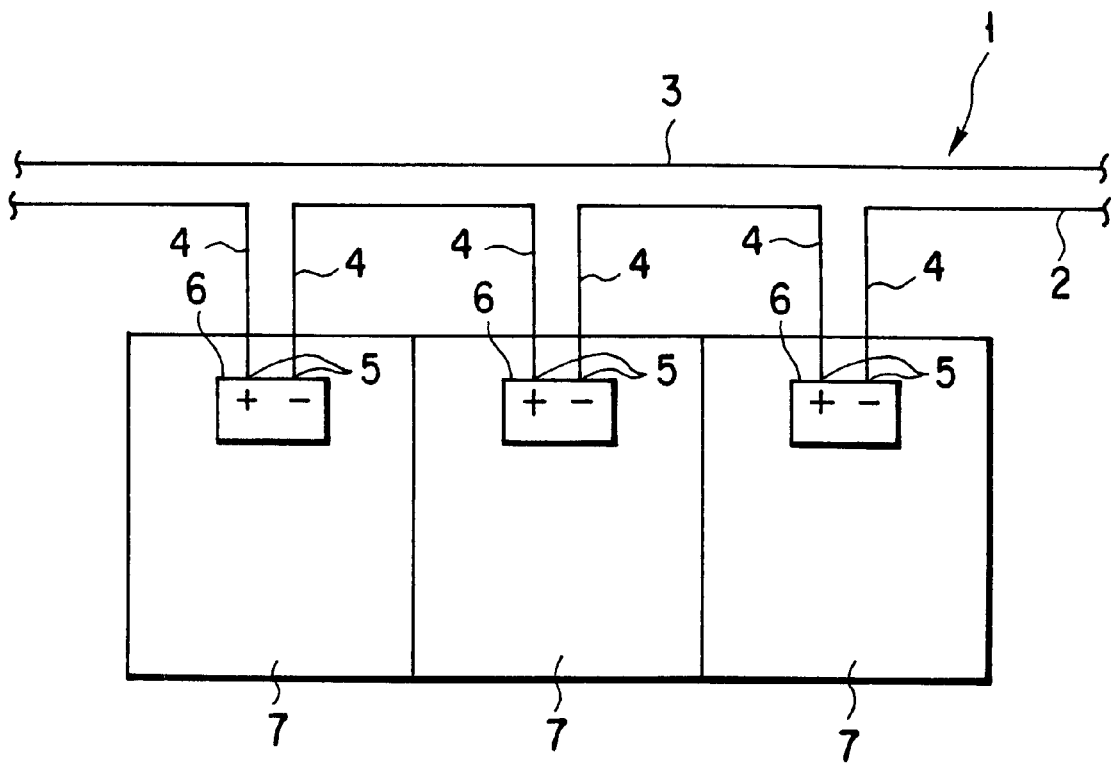
FIG. 24 is a circuit diagram showing a prior art wiring structure.

For other functions and effects than those described above, the sixth embodiment resembles the first embodiment, so that a repeated description will be omitted. As shown in FIGS. 23A, 23B and 23C, moreover, the sixth embodiment is also applicable to multi-core (e.g., two-core) wiring apparatuses. An auxiliary cable 99 shown in FIG. 23A includes a pair of electric wires 99a. One end of each wire 99a is connected to its corresponding one of a pair of connecting pins 97a that are arranged in the first connector 97 of the female type. The other end of each wire 99a is connected to its corresponding one of a pair of receptacle-shaped connecting terminals 98a that are arranged in the second connector 98 of the male type. With use of these connectors 97 and 98, the two-core auxiliary cable 99 can be connected to the two-core wiring apparatuses 16 and 17. As shown in the front views of FIGS. 23B and 23C, the connectors 97 and 98 of the auxiliary cable 99 have a bisymmetrical shape such that the connecting pins 97a and the connecting terminals 98a have directivity for connection. With this arrangement, the pins 97a and the terminals 98a can be connected without a mistake in polarity. This concept is also applicable to the connector connection for the single-core cables according to the first embodiment and the like. For example, a connector for positive electrode and a connector for negative electrode may have different shapes, so as to avoid wrong connection of them.

The present invention is not limited to the embodiments described above. For example, the components of the foregoing embodiments may be combined optionally or selectively to provide photovoltaic generation systems, wiring apparatuses, and wiring structures according to alternative embodiments that have functions equivalent to or different from those of the foregoing embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A wiring apparatus for a photovoltaic generation system for connecting respective output terminals of a plurality of generating sections each including photovoltaic modules, the wiring apparatus comprising:
   a trunk cable including a trunk conductor for conducting respective outputs of the generating sections;
   a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section;
   branch junctions formed between the trunk cable and the branch cables; and
   a plurality of connectors each attached to an end of the trunk cable or a branch cable and adapted to be removably fitted with a connector of an auxiliary cable and used for connecting the trunk cable and/or the branch cables with corresponding auxiliary cables.

2. A wiring apparatus for a photovoltaic generation system according to claim 1, wherein each branch junction includes a first cable connecting portion removably connected with the trunk cable and a second cable connecting portion removably connected with the branch cable, wherein a junction cable is connectable between the first cable connecting portion and the trunk cable, the junction cable having a first connector removably attachable to the first cable connecting portion and a second connector removably attachable to a connector of the trunk cable, and wherein another junction cable is connectable between the second cable connecting portion and each branch cable, said another junction cable having a first connector removably attachable to the second cable connecting portion and a second connector removably attachable to a connector of each branch cable.

3. A wiring apparatus for a photovoltaic generation system according to claim 2, wherein said trunk cable and said branch cable have two cores and said first cable connecting portion and said second cable connecting portion have two cores.

4. A wiring apparatus for a photovoltaic generation system according to claim 1, further comprising a protective sheath formed of a synthetic resin material covering the outer periphery of the trunk cable, protective sheaths formed of the synthetic resin material individually covering the respective outer peripheries of the branch cables, and cover members formed of the synthetic resin material and individually covering the respective outer peripheries of the branch junctions, the cover members being thermowelded to the protective sheath covering the outer periphery of the trunk cable and the protective sheaths covering the outer peripheries of the branch cables.

5. A wiring apparatus for a photovoltaic generation system according to claim 1, wherein said trunk cable and each branch cable are provided individually with connectors removably connected to the respective output terminals of the generating sections.

6. A wiring apparatus for a photovoltaic generation system according to claim 1, wherein said wiring apparatus includes said trunk cable, said branch cable and said branch junctions as an integral body, and said branch cables are arranged in a same direction in wiring, but in a direction different from that of said trunk cable.

7. A photovoltaic generation system comprising:
   a plurality of generating sections, each including photovoltaic modules located outside a building or module units formed by combining the photovoltaic modules, and
   wiring apparatuses for conducting respective outputs of the generating sections into the building, including a trunk cable including a trunk conductor, a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section, branch junctions formed between the trunk cable and the branch cables, and a plurality of connectors each attached to an end of the trunk cable or a branch cable and adapted to be removably fitted with a connector of an auxiliary cable and used for connecting the trunk cable and/or the branch cables with corresponding auxiliary cables.

8. A wiring structure for a photovoltaic generation system, including wiring apparatuses for conducting respective outputs of a plurality of generating sections each including photovoltaic modules located outside a building to loads in the building, each wiring apparatus comprising:
   a trunk cable including a trunk conductor for conducting the respective outputs of the generating sections,
   a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section,
   branch junctions formed between the trunk cable and the branch cables, and
   a plurality of connectors each attached to an end of the trunk cable or a branch cable and adapted to be removably fitted with a connector of an auxiliary cable and used for connecting the trunk cable and/or the branch cables with corresponding auxiliary cables;

wherein the respective output terminals of the generating sections are connected individually by means of the wiring apparatuses and either the trunk cable or lead-in wires connected thereto are led into the building.

9. A wiring apparatus for a photovoltaic generation system for connecting respective output terminals of a plurality of generating sections each including photovoltaic modules, the wiring apparatus comprising:

a trunk cable including a trunk conductor for conducting respective outputs of the generating sections;

a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section; and branch junctions formed between the trunk cable and the branch cables, each including a circuit changing switch capable of switching the connection between the generating sections to either a series- or a parallel-connection mode.

10. A photovoltaic generation system comprising:

a plurality of generating sections, each including photovoltaic modules located outside a building or module units formed by combining the photovoltaic modules, and wiring apparatuses for conducting the respective outputs of the generating sections into the building, including a trunk cable including a trunk conductor, a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section, and branch junctions formed between the trunk cable and the branch cables, each branch junction including a circuit changing switch capable of switching the connection between the generating sections to either a series- or a parallel-connection mode.

11. A wiring structure for a photovoltaic generation system, including wiring apparatuses for conducting respective outputs of a plurality of generating sections each including photovoltaic modules located outside a building to loads in the building, each wiring apparatus comprising:

a trunk cable including a trunk conductor for conducting the respective outputs of the generating sections, a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section, and branch junctions formed between the trunk cable and the branch cables, each including a circuit changing switch capable of switching the connection between the generating sections to either a series- or a parallel-connection mode;

wherein the respective output terminals of the generating sections are connected individually by means of the wiring apparatuses, and either the trunk cable or lead-in wires connected thereto are led into the building.

12. A wiring apparatus for a photovoltaic generation system for connecting respective output terminals of a plurality of generating sections each including photovoltaic modules, the wiring apparatus comprising:

a trunk cable including a trunk conductor for conducting the respective outputs of the generating sections;

a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section; and branch junctions formed between the trunk cable and the branch cables, each including an electric circuit for connecting the generating sections in parallel with one another, the electric circuit having a check diode for preventing current from flowing from higher-output generating sections, out of the parallel-connected generating sections, to lower-output generating sections.

13. A photovoltaic generation system comprising:

a plurality of generating sections, each including photovoltaic modules located outside a building or module units formed by combining the photovoltaic modules, and wiring apparatuses for conducting the respective outputs of the generating sections into the building, said wiring apparatuses including a trunk cable including a trunk conductor, a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section, and branch junctions formed between the trunk cable and the branch cables, each branch junction including an electric circuit for connecting the generating sections in parallel with one another, the electric circuit having a check diode for preventing current from flowing from higher-output generating sections, out of the parallel-connected generating sections, to lower-output generating sections.

14. A wiring structure for a photovoltaic generation system, including wiring apparatuses for conducting respective outputs of a plurality of generating sections each including photovoltaic modules located outside a building to loads in the building, each wiring apparatus comprising:

a trunk cable including a trunk conductor for conducting the respective outputs of the generating sections, a plurality of branch cables diverging individually from a plurality of longitudinally intermediate portions of the trunk cable, each branch cable including a branch conductor having one end connected electrically to a longitudinally intermediate portion of the trunk conductor and the other end connected electrically to the output terminal of each corresponding generating section, and branch junctions formed between the trunk cable and the branch cables, each including an electric circuit for connecting the generating sections in parallel with one another, the electric circuit having a check diode for preventing current from flowing from higher-output generating sections, out of the parallel-connected generating sections, to lower-output generating sections;

wherein the respective output terminals of the generating sections are connected individually by means of the wiring apparatuses, and either the trunk cable or lead-in wires connected thereto are led into the building.

* * * * *